US009313891B2

(12) United States Patent
Jung et al.

(10) Patent No.: US 9,313,891 B2
(45) Date of Patent: Apr. 12, 2016

(54) SLOT-MOUNTED PRINTED CIRCUIT BOARD HAVING SMALL INSERTION FORCE

(71) Applicants: Jin-San Jung, Asan-si (KR); Joo-Han Lee, Asan-si (KR); Hyun-Seok Choi, Asan-si (KR)

(72) Inventors: Jin-San Jung, Asan-si (KR); Joo-Han Lee, Asan-si (KR); Hyun-Seok Choi, Asan-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 511 days.

(21) Appl. No.: 13/759,504

(22) Filed: Feb. 5, 2013

(65) Prior Publication Data
US 2013/0314887 A1 Nov. 28, 2013

(30) Foreign Application Priority Data

May 25, 2012 (KR) ........................ 10-2012-0056232

(51) Int. Cl.
*H05K 1/14* (2006.01)
*H05K 3/02* (2006.01)
*H05K 3/22* (2006.01)
(Continued)

(52) U.S. Cl.
CPC ................ *H05K 1/141* (2013.01); *H05K 1/117* (2013.01); *H05K 3/02* (2013.01); *H05K 3/22* (2013.01); *H05K 3/0052* (2013.01); *H05K 2201/09154* (2013.01); *H05K 2201/09172* (2013.01); *H05K 2201/10159* (2013.01); *H05K 2203/0228* (2013.01); *Y10T 29/49155* (2015.01); *Y10T 29/49156* (2015.01)

(58) Field of Classification Search
CPC ........... H05K 3/02; H05K 3/22; H05K 1/141; H05K 1/14
USPC ......... 361/728, 729, 760, 777, 783–785, 789, 361/790, 792–795
See application file for complete search history.

(56) References Cited

U.S. PATENT DOCUMENTS

| | | | | |
|---|---|---|---|---|
| 5,751,553 | A | * | 5/1998 | Clayton ......................... 361/749 |
| 7,511,968 | B2 | * | 3/2009 | Goodwin ....................... 361/803 |
| 7,616,452 | B2 | * | 11/2009 | Wehrly, Jr. ............. H05K 1/189 |
| | | | | 174/254 |

(Continued)

FOREIGN PATENT DOCUMENTS

| | | |
|---|---|---|
| JP | 2005-228969 | 8/2005 |
| JP | 2011-171349 | 9/2011 |

(Continued)

OTHER PUBLICATIONS

English Abstract for Publication No. 10-2007-0019474.
(Continued)

*Primary Examiner* — Jenny L Wagner
*Assistant Examiner* — Michael P McFadden
(74) *Attorney, Agent, or Firm* — F. Chau & Associates, LLC

(57) ABSTRACT

A printed circuit board (PCB) prevents damage to tabs of the PCB and pins of a slot by reducing insertion force when the PCB is inserted in the slot. The PCB includes a body portion including a first surface and a second surface and a metal interconnection layer formed on at least one of the first and second surfaces. The metal interconnecting layer includes tabs formed along a first edge of the body portion. An insertion force alleviation portion in which at least a portion of the body portion is removed is formed in the first edge to reduce the insertion force required to seat the PCB within the slot.

14 Claims, 16 Drawing Sheets

(51) Int. Cl.
H05K 1/11 (2006.01)
H05K 3/00 (2006.01)

(56) References Cited

U.S. PATENT DOCUMENTS

| | | | | |
|---|---|---|---|---|
| 7,626,259 | B2 * | 12/2009 | Wehrly et al. | 257/707 |
| 7,724,530 | B2 * | 5/2010 | Clayton et al. | 361/749 |
| 2006/0050498 | A1 * | 3/2006 | Cady et al. | 361/803 |
| 2010/0061072 | A1 | 3/2010 | Imazato et al. | |
| 2010/0103296 | A1 | 4/2010 | Makagiri et al. | |
| 2010/0270923 | A1 | 10/2010 | Froehlich et al. | |
| 2010/0294546 | A1 | 11/2010 | Nickel et al. | |
| 2010/0330725 | A1 | 12/2010 | Yoshizawa et al. | |
| 2012/0018209 | A1 | 1/2012 | Liao | |

FOREIGN PATENT DOCUMENTS

| | | |
|---|---|---|
| KR | 10-2002-0090047 | 11/2002 |
| KR | 10-2007-0019474 | 2/2007 |

OTHER PUBLICATIONS

English Abstract for Publication No. 10-2002-0090047.
English Abstract for Publication No. 2011-171349.
English Abstract for Publication No. 2005-228969.

* cited by examiner

US 9,313,891 B2

SLOT-MOUNTED PRINTED CIRCUIT BOARD HAVING SMALL INSERTION FORCE

CROSS-REFERENCE TO RELATED APPLICATIONS

This application claims the benefit of Korean Patent Application No. 10-2012-0056232, filed on May 25, 2012, in the Korean Intellectual Property Office, the disclosure of which is incorporated herein in its entirety by reference.

TECHNICAL FIELD

The inventive concept relates to a printed circuit board (PCB), and more particularly, to a PCB mounted on a main board by the use of a slot and requiring a small insertion force, and a method of manufacturing the PCB.

Generally, a central processing unit (CPU) and expansion boards for peripheral devices may be mounted on a main board of a personal computer, which is also known as a motherboard. The CPU, which may be embodied as a microprocessor, may be mounted on the main board using a socket or a slot receiving structure. Also, expansion boards, such as graphics cards and the like, may be mounted on the main board by being inserted into expansion slots such as peripheral component interconnect (PCI) Express slots.

Memory modules may also be mounted on the main board. Connection pins or contact tabs are formed on the PCB for the memory module and the PCB is inserted into a slot installed in a main board. Memory modules may be classified as a single in-line memory module (SIMM) having a structure in which tabs are formed on one side of the PCB or a dual in-line memory module (DIMM) having a structure in which tabs are formed on both sides of the PCB.

SUMMARY

A printed circuit board (PCB) configured to be inserted into a slot is provided with tabs for making contact with pins of the slot. Damage to the tabs of the PCB and the pins of the slot is prevented by reducing an insertion force required to inert the PCB into the slot.

A method of manufacturing the PCB is also provided.

A system including the PCB is also provided.

According to an aspect of the inventive concept, there is provided a printed circuit board (PCB) including a body portion including a first surface and a second surface opposite to the first surface. A metal interconnection layer is formed on at least one of the first and second surfaces. The metal interconnection layer includes a plurality of tabs formed along a first edge of the body portion. An insertion force alleviation portion having a form in which at least a portion of the body portion is removed is formed in the first edge so that a reduced insertion force is required to seat the tabs of the PCB within a socket or slot.

The insertion force alleviation portion may include grooves or holes for reducing physical resistance to pins of a slot when the PCB is inserted into the slot.

The grooves may be formed in the first edge and may be formed on either the first or second surface or in both the first and second surfaces. The grooves may be formed such that a thickness of the body portion decreases in the direction of the first edge from the center of the body portion.

The grooves may be formed to correspond to the plurality of tabs according to a predetermined disposition rule. Each of the grooves may be formed to correspond to each of the plurality of tabs, or each of the grooves may be formed to correspond to two tabs of the plurality of tabs.

The holes may be formed in the first edge, and horizontal cross sections of the holes may have a circular, elliptical, or polygonal form of which a portion is opened in the direction of the first edge. A groove may be formed in each of the holes.

The PCB may be a PCB for a memory module on which at least one memory chip is mounted.

According to an aspect of the inventive concept, there is provided a method of manufacturing a printed circuit board (PCB). The method includes forming an internal interconnection layer on an original plate layer. An insulation layer is stacked on the original plate layer and the internal interconnection layer. A contact hole is formed penetrating the insulation layer. At least one insertion force alleviation portion is formed by removing at least a portion of the insulation layer along a predetermined line. An external interconnection layer is formed on the insulation layer. A resultant structure in which the external interconnection layer has been formed is divided into separate PCBs, each having a first edge, in which the at least one insertion force alleviation portion is disposed, by cutting the resultant structure along the predetermined line.

The forming of the external interconnection layer may include performing copper plating on an upper surface of the insulation layer and the inside of the contact hole. The copper plating on the upper surface of the insulation layer may be patterned. The external interconnection layer may be electrically connected to the internal interconnection layer through a portion of the copper plating which has been formed in the inside of the contact hole.

The insertion force alleviation portion may be free of the copper plating after patterning the copper plating.

The external interconnection layer may include a plurality of tabs and a tie-bar for connecting two tabs to each other. The insertion force alleviation portion may be formed adjacent to the tie-bar and/or between ends of two tabs connected to each other by the tie-bar. The insertion force alleviation portion may have a structure opened in the direction of the first edge when the tie-bar is cut in the dividing of the resultant structure into the separate PCBs.

The internal interconnection layer may include a first interconnection layer formed on an upper surface of the original plate layer and a second internal interconnection layer formed on a lower surface of the original plate layer. The insulation layer may include a first insulation layer formed on the upper surface of the original plate layer and the first internal interconnection layer and a second insulation layer formed on the lower surface of the original plate layer and the second internal interconnection layer. The contact hole may be formed in each of the first and second insulation layers. The external interconnection layer may include a first external interconnection layer formed on the first insulation layer and a second external interconnection layer formed on the second insulation layer. The insertion force alleviation portion may be formed by removing a portion of each of the first and second insulation layers or may be formed through the original plate layer and the first and second insulation layers.

According to an aspect of the inventive concept, a system includes a main board. At least one slot is installed on the main board. A printed circuit board (PCB), on which at least one memory chip is mounted, includes an insertion portion that is insertable into the at least one slot, in which grooves or holes are formed in a first edge portion of the insertion portion. The grooves or the holes reduce physical resistance to pins of the at least one slot when the PCB is inserted into the at least one slot.

According to an aspect of the inventive concept, there is provided a printed circuit board (PCB) having a structure that is insertable into a slot. A plurality of tabs are formed on a first edge portion of the PCB, which is inserted into the slot, and grooves or holes for reducing physical resistance to pins of the slot when the PCB is inserted into the slot are formed in the first edge portion according to a predetermined disposition rule with respect to the plurality of tabs.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1:
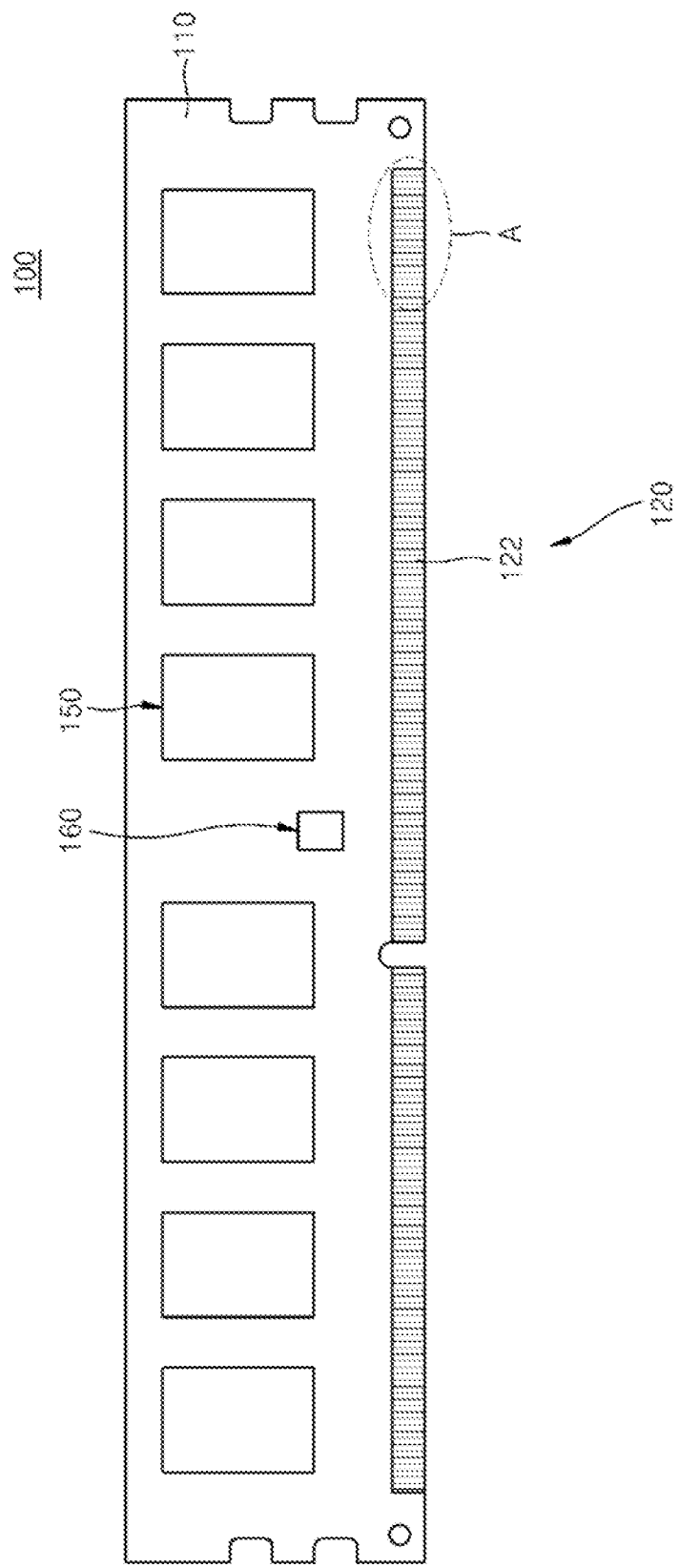
FIG. 1 is a plan view illustrating a printed circuit board (PCB) according to an exemplary embodiment of the inventive concept.

Hereinafter, the inventive concept will be described more fully with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those of ordinary skill in the art.

In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In drawings, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the drawings, like reference numerals may denote like elements throughout. Further, various elements and regions are schematically illustrated, and thus, are not limited by relative sizes or intervals illustrated.

FIG. 1 is a plan view illustrating a printed circuit board (PCB) 100 according to an exemplary embodiment of the inventive concept.

Referring to FIG. 1, the PCB 100 is a substrate on which a plurality of semiconductor chips 150 are mounted, and a plurality of tabs 122 may be formed on one side edge portion of the PCB 100. The plurality of tabs 122 may constitute a portion of an external interconnection layer 120 exposed to the outside of a body portion 110. As the edge portion on which the plurality of tabs 122 are formed is inserted into a slot (not shown) installed on a main board (not shown), the PCB 100 may be mounted on the main board and the plurality of tabs 122 may serve as electrical contacts establishing an electrical connection between the PCB 100 and the main board.

The PCB 100 is made by coating a conductive foil such as copper (Cu), silver (Ag), or gold (Au) on a flat board formed by compressing phenol, epoxy glass resins, or the like to a predetermined thickness. A circuit interconnection line is formed by patterning the Cu foil and electronic components, such as semiconductor chips and the like, are mounted on the PCB 100 through a bump.

The PCB 100 may be a single layer PCB, in which an interconnection line is formed on only one side thereof or a double layer PCB in which an interconnection line is formed on both sides thereof. In addition, the Cu foil may be formed with three or more layers by using an insulator called prepreg and three or more interconnection layers may be formed on the PCB 100 according to the number of layers of the Cu foil. Interconnection lines (not shown) exposed to the outside may be electrically connected to the tabs 122 formed on the edge portion through contacts and internal interconnection lines. The interconnection lines exposed to the outside and the tabs may constitute the external interconnection layer 120 of the PCB 100.

Although not illustrated in FIG. 1, interconnection lines constituting the external interconnection layer 120 may be densely formed with a predetermined pattern in and around an area on which the semiconductor chips 150 are mounted. In the area, the semiconductor chips 150 may be mounted by using a flip-chip method and the semiconductor chips 150 may be electrically connected to the interconnection lines. The semiconductor chips 150 mounted on the PCB 100 may be memory chips and/or logic chips. When the semiconductor chips 150 are memory chips, the semiconductor chips 150 may include a DRAM, an SRAM, a flash memory, an EEPROM, a PRAM, an MRAM, and/or an RRAM, and the PCB 100 on which the memory chips have been mounted may constitute a memory module.

As stated above, the semiconductor chips 150 may be mounted on only one side of the PCB 100, or may be mounted on both sides of the PCB. In addition, although eight semiconductor chips are illustrated in FIG. 1, the inventive concept is not limited thereto. For example, less than eight semiconductor chips may be mounted on the PCB 100 or more than eight semiconductor chips may be mounted on the PCB 100. For example, eight semiconductor chips may be mounted on one side of the PCB 100 and also eight semiconductor chips may be mounted on the other side of the PCB.

Although in FIG. 1, the semiconductor chips 150 are simply illustrated as tetragons, the semiconductor chips 150 are not necessarily mounted on the PCB 100 in the form of a bare chip but may be mounted on the PCB 100 in the form of package sealed by a sealant. A buffer chip 160 may be further mounted on the PCB 100. The buffer chip 160 is disposed between a DRAM and a memory controller and performs a function of relaying data in transmission. For example, the buffer chip 160 may be an advanced memory buffer (AMB). In this case, the AMB is connected to all DRAMs mounted on a memory module, stores data transmitted from the memory controller into a DRAM, reads data requested by the memory controller from a DRAM, and then transmits the read data to the memory controller. In addition, a request for data storing and reading from the memory controller may be transmitted to an AMB of a memory module mounted in a next slot. By including the buffer chip 160, a high transmission bandwidth and high capacity memory module may be implemented. Although the buffer chip 160 is disposed in the memory module, e.g., the PCB 100 according to an exemplary embodiment of the inventive concept, the buffer chip 160 need not be disposed on the memory module.

In the PCB 100, the tabs 122 may be formed on only one side of the PCB 100 or may be formed on both sides of the PCB 100. In addition, a plurality of grooves or a plurality of holes may be formed in an edge portion of the PCB 100 on which the tabs 122 are formed, according to a predetermined rule. In this case, the grooves may be formed in a concave form by removing a portion of the upper side and/or lower side of the body portion 110 constituting the PCB 100 and the holes may be formed through the body portion 110.

The grooves or the holes are formed in the edge portion of the PCB 100 on which the tabs 122 are formed. Accordingly, an insertion force that is required to be applied to the PCB 100 when inserting it into a slot decreases and thus, the PCB 100 may be more easily inserted into a slot while using a smaller insertion force. In addition, due to the decrease of the insertion force required to seat the PCB 100, damage to the tabs 122 of the PCB 100 and/or pins of the slot may be prevented, thereby preventing a fault of the PCB 100 or the slot and ensuring a proper electrical connecting between the PCB and the main board. Furthermore, correct coupling between the tabs 122 of the PCB 100 and the pins of the slot may be facilitated due to the existence of the grooves or the holes and the PCB 100 may be stably inserted into and coupled to the slot, and thus, a contact fault between the PCB 100 and the slot may be prevented. Forms, arrangement rules, and functions of the grooves or the holes that are formed in the PCB 100 are described below with reference to FIGS. 2A through 11 below.

A SIMM is an example of a memory module having tabs formed on only one side of a PCB. A DIMM is an example of a memory module having tabs formed on both sides of the PCB. In the PCB 100 according to an exemplary embodiment of the inventive concept, the tabs 122 may be formed on one side or both sides of the PCB 100. Accordingly, when a memory module is formed of the PCB 100, the memory module may be a SIMM or a DIMM. A structure or a device into which a PCB is inserted may be called a socket or a slot. Sockets or slots may have pins formed therein to correspond to the tables of the PCB.

Figure 2A:
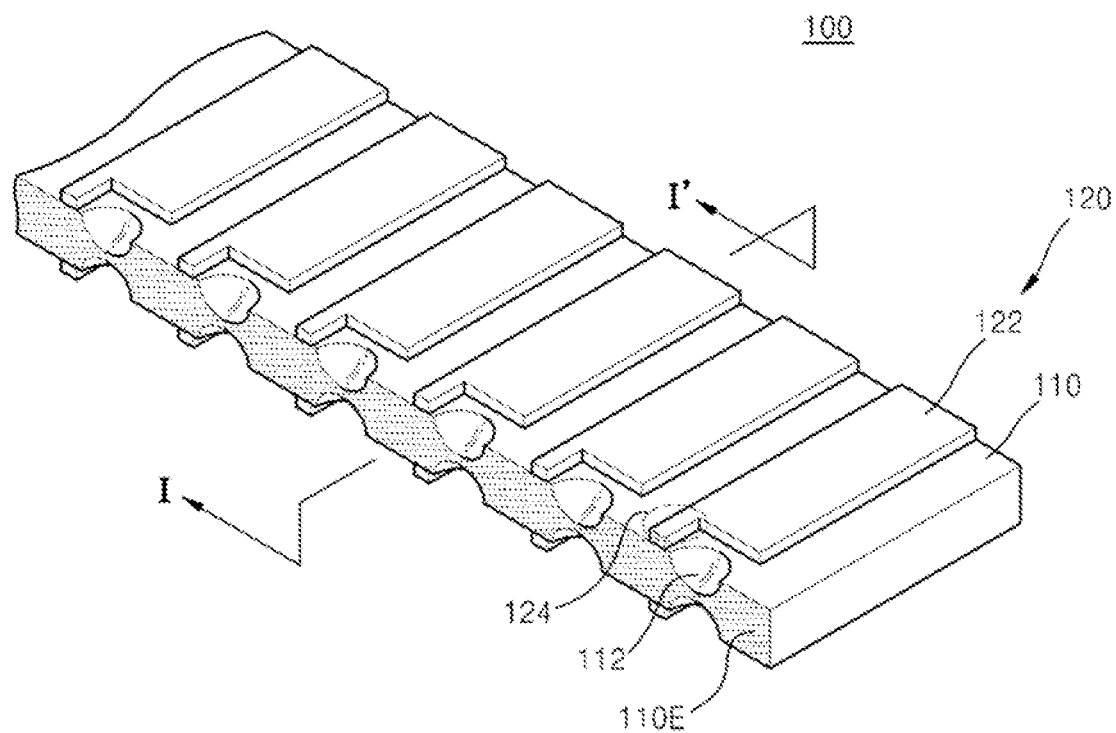
FIG. 2A is a perspective view illustrating a magnification of portion A of FIG. 1.
Figure 2B:
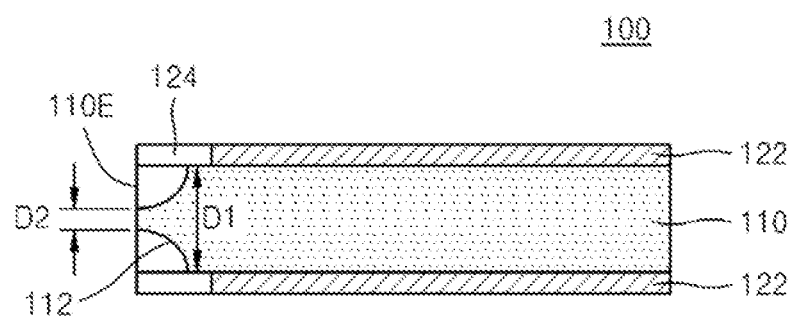
FIG. 2B is a cross-sectional view taken along line I-I' of FIG. 2A.

FIG. 2A is a perspective view illustrating a magnification of portion A of FIG. 1 and FIG. 2B is a cross-sectional view taken along line I-I' of FIG. 2A.

Referring to FIGS. 2A and 2B, the PCB 100 may include the body portion 110 and the tabs 122 formed on the body portion 110. The tabs 122 may constitute a portion of the external interconnection layer 120 exposed to the outside of the body portion 110. Tie-bars 124 that protrude in an edge direction may be formed at end portions of the tabs 122. As illustrated in FIGS. 2A and 2B, grooves 112 may be formed at an edge side 110E of the body portion 110 on which the plurality of tabs 122 are disposed. The grooves so formed do not fully penetrate the thickness of the PCB and when there are aligned grooves on opposing edges of the PCB, the grooves still might not meet each other at the center of the thickness of the PCB.

The grooves 112 may be formed by removing portions of the upper side and lower side of the body portion 110. The grooves 112 may be formed such that a thickness of the body portion 110 decreases in the direction of the edge side 110E from the center of the body portion 110, for example, in the direction of the left side from the right side in FIG. 2B. For example, when the center of the body portion 110 has a first thickness D1, the edge side 110E where the grooves 112 are formed may have a second thickness D2 that may be smaller than the first thickness D1. The thickness of the body portion 110 may gradually decrease from the first thickness D1 to the second thickness D2 towards the edge side 110E of the body portion 110. Although in FIGS. 2A and 2B, the grooves 112 are formed in both sides of the body portion 110, the grooves 112 may alternatively be formed in only one side of the body portion 110.

The grooves 112 may be formed adjacent to the tie-bars 124 at the end portions of the tabs 112. Although here, the grooves 112 are formed to respectively correspond to the tabs 122, the inventive concept is not limited thereto and the grooves 112 may be formed according to another disposition rule, which is described below with reference to FIGS. 14A and 14B below.

The plurality of grooves 112 may be formed in the edge portion in which the tabs 122 are formed. Accordingly, insertion force may be substantially decreased when the PCB 100 is inserted into a slot and thus damage to the PCB 100, damage to the slot, and a contact fault between the PCB 100 and the slot may be prevented. The reduction of the insertion force due to a structure of the PCB 100 is described with reference to FIGS. 9 and 10 below.

Figure 3A:
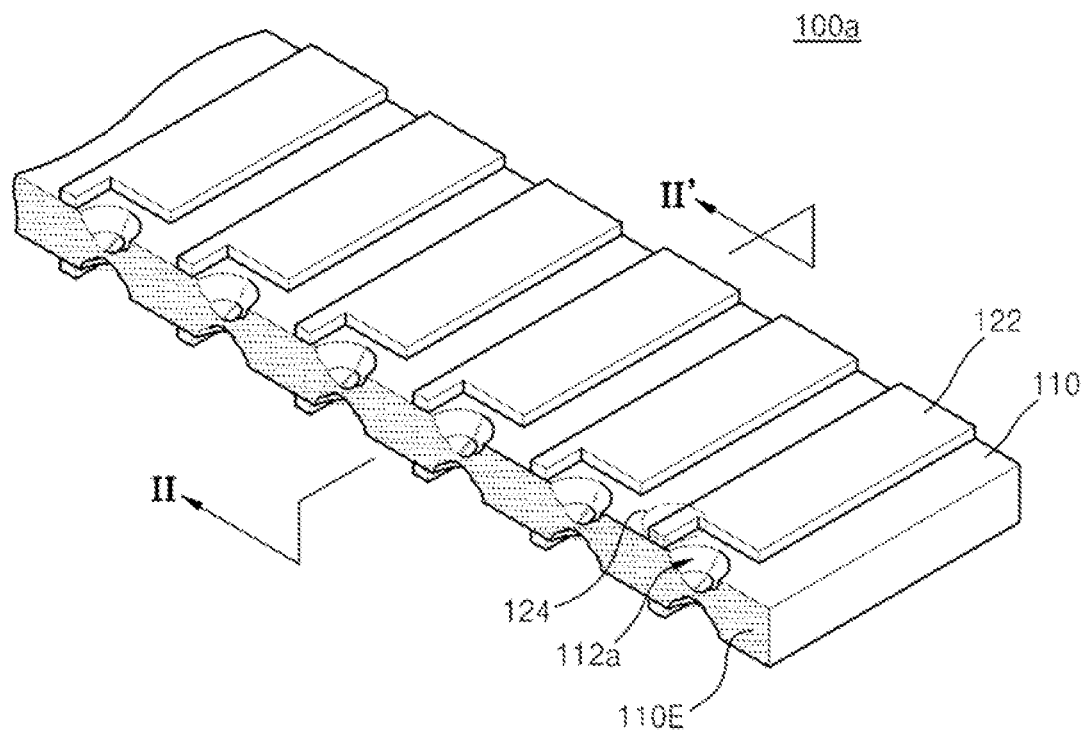
FIG. 3A is a perspective view illustrating an example of a modification of the PCB of FIG. 2A.
Figure 3B:
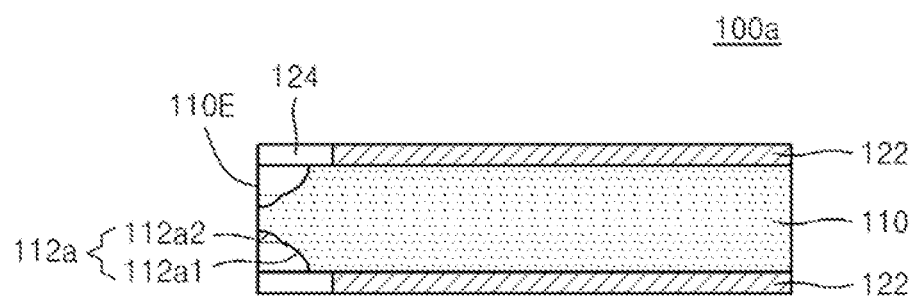
FIG. 3B is a cross-sectional view taken along line □-□' of FIG. 3A.

FIG. 3A is a perspective view illustrating an example of a modification of the PCB 100 of FIG. 2A and FIG. 3B is a cross-sectional view taken along line ☐-☐' of FIG. 3A. For convenience of explanation, descriptions for similar elements previously provided with reference to FIGS. 2A and 2B are omitted.

Referring to FIGS. 3A and 3B, in a PCB 100a according to an exemplary embodiment of the inventive concept, grooves 112a may be formed such that a thickness of a body portion 110 decreases in the direction of an edge side 110E from the center of the body portion 110, for example, in the direction of the left side from the right side in FIG. 3B. Also, the grooves 112a may include two portions having different curvature geometries. For example, each of the grooves 112a may include a first groove $112a_1$ having a first curvature and a second groove $112a_2$ having a second curvature. The first and second curvature geometries may be adequately adjusted according to a reduction of insertion force that is desired for the PCB 100a.

Although as shown, the grooves 112a are formed to have two different curvature geometries, the grooves 112a may be formed to have three or more different curvature geometries. Since the grooves 112a are formed to have different curvature geometries, when the PCB 100a is inserted into a slot, insertion force sequentially increases and thus the PCB 100a may be a little more softly and stably inserted into the slot. For example, by decreasing a curvature of the first groove $112a_1$, an angle between the first groove $112a_1$ and an upper side of the body portion 110 or upper sides of tabs 122 may be decreased, and thus, resistance occurring when pins of a slot enter onto the upper side of the body portion 110, e.g., insertion force, may be decreased.

Figure 4A:
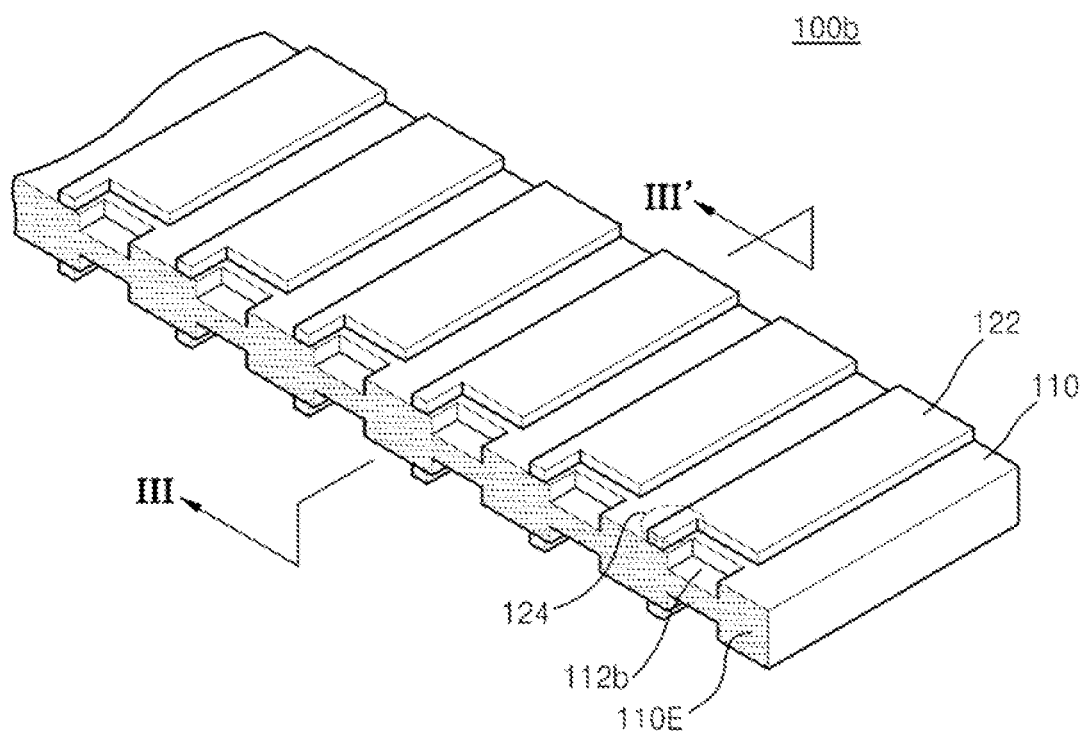
FIG. 4A is a perspective view illustrating an example of a modification of the PCB of FIG. 2A.
Figure 4B:
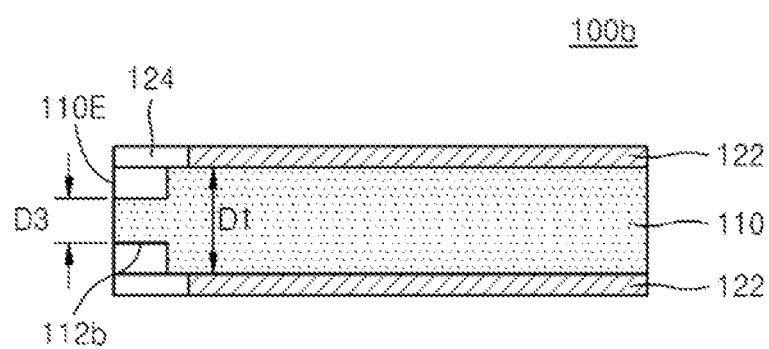
FIG. 4B is a cross-sectional view taken along line □-□' of FIG. 4A.

FIG. 4A is a perspective view illustrating an example of a modification of FIG. 2A and FIG. 4B is a cross-sectional view taken along line ☐-☐' of FIG. 4A. For convenience of explanation, descriptions previously provided with reference to FIGS. 2A through 3B are omitted.

Referring to FIGS. 4A and 4B, in a PCB 100b according to an exemplary embodiment of the inventive concept, rectangular grooves 112b may be formed at an edge side 110E of a body portion 110. For example, horizontal cross sections of the grooves 112b may be rectangular and bottom sides of the grooves 112b may form a step with respect to an upper side of a central portion of the body portion 110. In addition, the body portion 110 may have a third thickness D3 where the grooves 112b are formed and the third thickness D3 may be smaller than a first thickness D1 of a central portion of the body portion 110. Unlike in the exemplary embodiment illustrated in FIG. 2A or 3A, the body portion 110 may have a constant thickness where the grooves 112b are formed.

Figure 5A:
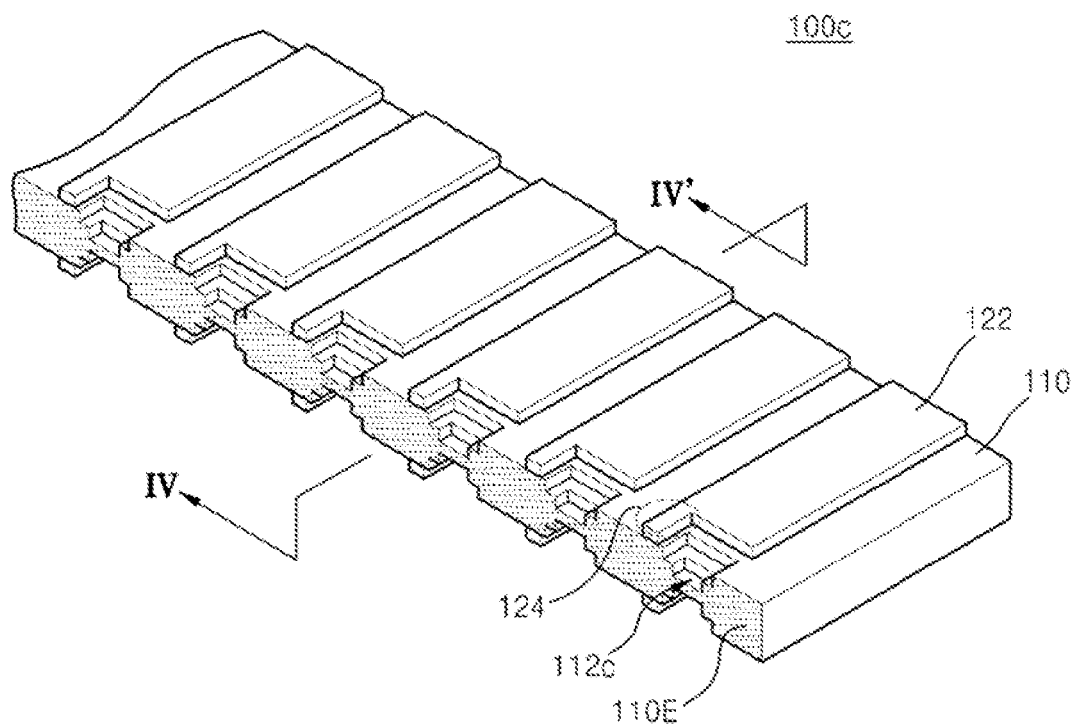
FIG. 5A is a perspective view illustrating an example of a modification of the PCB of FIG. 2A.
Figure 5B:
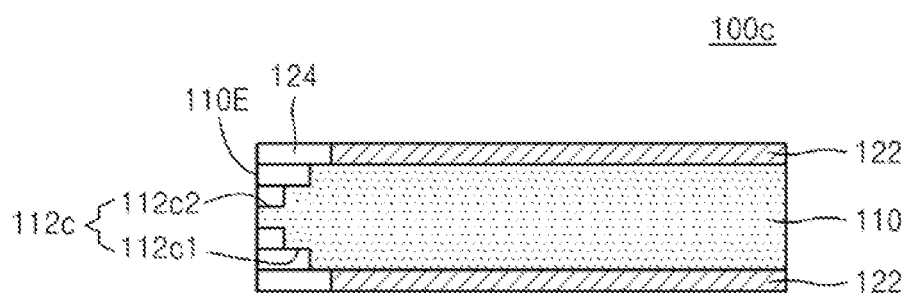
FIG. 5B is a cross-sectional view taken along line □-□' of FIG. 5A.

FIG. 5A is a perspective view illustrating an example of a modification of the PCB 100 of FIG. 2A and FIG. 5B is a cross-sectional view taken along line ☐-☐' of FIG. 5A. For convenience of explanation, further description of elements substantially similar to those previously provided with reference to FIGS. 2A through 4B are omitted.

Referring to FIGS. 5A and 5B, in a PCB 100c according to an exemplary embodiment of the inventive concept, grooves 112c may be formed at an edge side 110E of a body portion 110 with two steps. For example, each of the grooves 112c may include a first groove $112c_1$ having a first bottom side and a second groove $112c_2$ having a second bottom side. One step may be formed between the first bottom side of the first groove $112c_1$ and the second bottom side of the second groove $112c_2$ and the other step may be formed between the first bottom side of the first groove $112c_1$ and an upper side of a central portion of the body portion 110.

Accordingly, the thickness of the body portion 110 in which the first groove $112c_1$ is formed, the thickness of the body portion 110 in which the second groove $112c_2$ is formed, and the thickness of the central portion of the body portion 110 may be different from one another. The thickness of the body portion 110 may be constant where the first groove $112c_1$ is formed and may also be constant where the second groove $112c_2$ is formed. A function of the grooves 112c of the PCB 100c may be similar to that of the grooves 112a described above with reference to FIG. 3A. For example, when the PCB 100c is inserted into a slot, insertion force sequentially increases and thus the PCB 100c may be a little more softly and stably inserted into the slot.

Figure 6A:
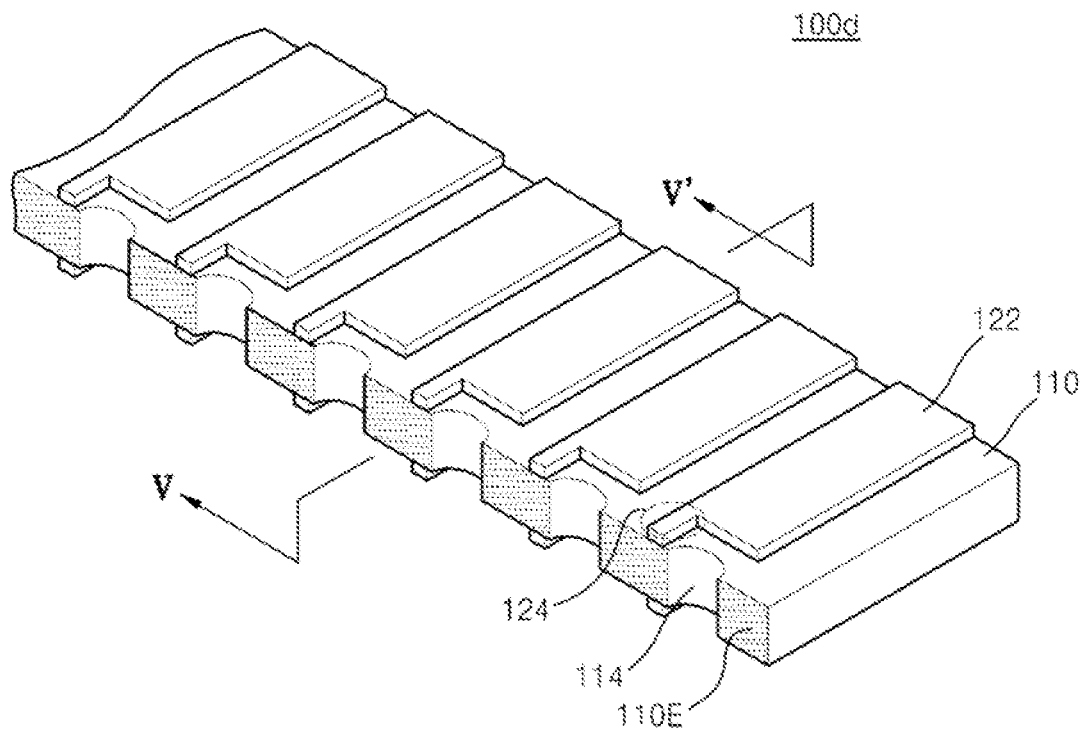
FIG. 6A is a perspective view illustrating an example of a modification of the PCB of FIG. 2A.
Figure 6B:
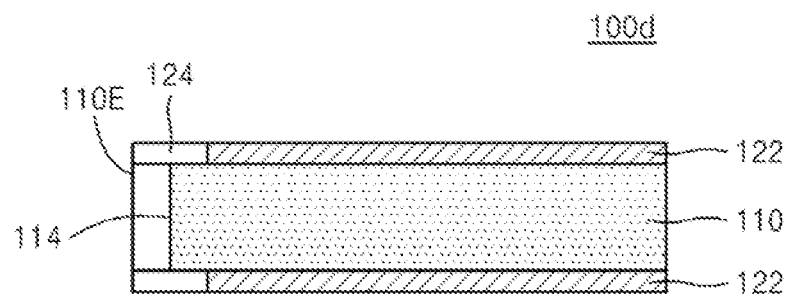
FIG. 6B is a cross-sectional view taken along line □-□' of FIG. 6A.

FIG. 6A is a perspective view illustrating an example of a modification of the PCB 100 of FIG. 2A and FIG. 6B is a cross-sectional view taken along line ☐-☐' of FIG. 6A. For convenience of explanation, further description of elements substantially similar to those previously provided with reference to FIGS. 2A through 5B are omitted.

Referring to FIGS. 6A and 6B, in a PCB 100d according to an exemplary embodiment of the inventive concept, holes 114 may be formed. Unlike in the exemplary embodiments described above, the holes 114 may be formed through the body portion 110 in a thickness direction thereof. The holes 114 formed in the PCB 100d may have an open hole structure towards the edge side 110E. For example, horizontal cross sections of the holes 114 may have a circular or polygonal form opened in one direction.

The holes 114 formed in the PCB 100d may be formed at the edge side 110E by cutting the PCB along a predetermined line after forming holes through the body portion 110 by using a drill or a laser.

The holes 114 formed in the PCB 100d may have a function of guiding tabs 122 of the PCB 100d to be correctly coupled to corresponding pins of a slot, as well as a function of reducing insertion force. The function of guiding the tabs 122 of the PCB 100d to be correctly coupled to corresponding pins of a slot by using grooves or holes is described below with reference to FIG. 11.

Figure 7A:
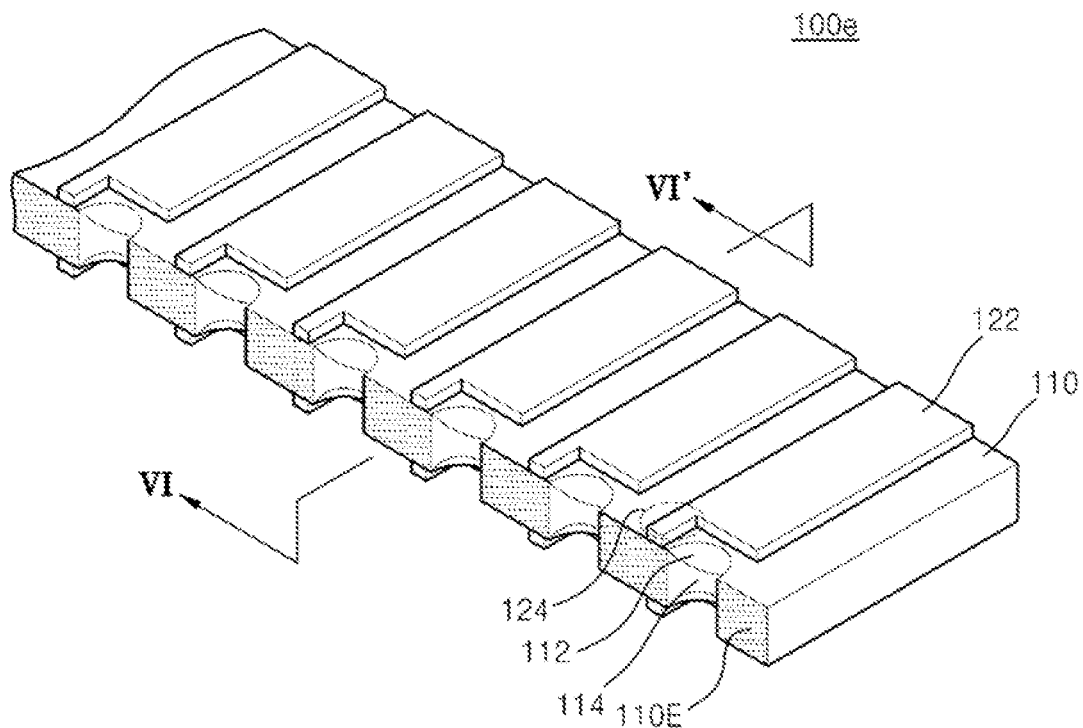
FIG. 7A is a perspective view illustrating an example of a modification of the PCB of FIG. 2A.
Figure 7B:
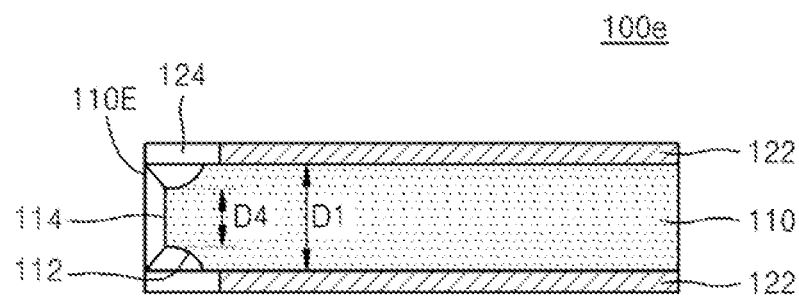
FIG. 7B is a cross-sectional view taken along line □-□' of FIG. 7A.
Figure 8A:
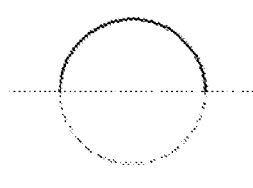
FIGS. 8A through 8F are conceptual diagrams showing various forms of a horizontal cross section of each hole of FIG. 6A.
Figure 8B:
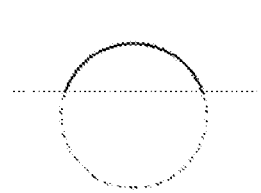
Figure 8C:
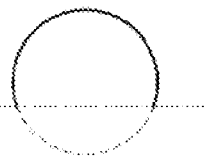
Figure 8D:
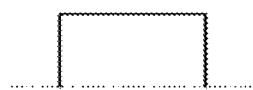
Figure 8E:
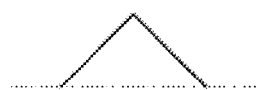
Figure 8F:

FIG. 7A is a perspective view illustrating an example of a modification of the PCB 100 of FIG. 2A and FIG. 7B is a cross-sectional view taken along line ☐-☐' of FIG. 7A. For convenience of explanation, further descriptions of elements substantially similar to those previously provided with reference to FIGS. 2A through 6B are omitted.

Referring to FIGS. 7A and 7B, in a PCB 100e according to an exemplary embodiment of the inventive concept, both holes 114 and grooves 112 may be formed at an edge side 110E. For example, the holes 114 have a concave structure with respect to the edge side 110E. In addition, the grooves 112 are formed on the inner side of the holes 114, and thus, a body portion 110 may have a fourth thickness D4 at the inner side of the holes 114. For example, the grooves 112 may be formed such that the thickness of the body portion 110 gradually decreases from a first thickness D1 of a central portion of the body portion 110 to the fourth thickness D4 at the inner side of the holes 114.

In the PCB 100e, as both the holes 114 and the grooves 112 are formed in an edge portion on which tabs 122 are formed, grooves 112 of the PCB 100 of FIG. 2A and the holes 114 of the PCB 100d of FIG. 6A may work together to further reduce the required insertion force and to further guide the tabs 122 of the PCB 100e to be correctly coupled to corresponding pins of a slot. Although the PCB 100e is illustrated as having a structure in which the grooves 112 of the PCB 100 of FIG. 2A and the holes 114 of the PCB 100d of FIG. 6A are combined, the inventive concept is not limited thereto. For example, the PCB 100e may have a structure in which the grooves formed in the PCB 100a of FIG. 3A, the PCB 100b of FIG. 4A, and/or the PCB 100c of FIG. 5A and the holes 114 of the PCB 100d of FIG. 6A are combined.

Furthermore, the inventive concept is not limited to the structure of the grooves or holes exemplified above. For example, PCBs according to exemplary embodiments of the inventive concept may have grooves or holes of other forms that may reduce insertion force and facilitate correct coupling between tabs of a PCB and pins of a slot when inserting the PCB into the slot.

FIG. 8 is a conceptual diagram showing various forms of a horizontal cross section of each of the holes 114 of FIG. 6A.

Referring to FIGS. 8A-8F, the holes 114 formed in the PCB 100d of FIG. 6A may have various structures. For example, as illustrated in FIG. 8, a horizontal cross section of each of the holes 114 may have various forms such as a half-circle (FIG. 8A), one-third of a circle (FIG. 8B), two-thirds of a circle (FIG. 8C), a rectangle (FIG. 8D), a triangle (FIG. 8E), a trapezoid (FIG. 8F), or the like. In FIG. 8, solid lines indicate portions constituting holes, and alternated long and short dash lines indicate open portions.

The horizontal cross section of each of the holes 114 is not limited to the forms illustrated in FIG. 8. For example, various holes having a cross section of a circle, an ellipse, or a polygon, of which any one side portion is open may be formed. In addition, although not illustrated, the inventive concept is not limited to the groove structures of FIGS. 2A through 5A, and various forms of grooves may be formed. Such holes or grooves may have forms that may reduce insertion force and also facilitate correct coupling between tabs of a PCB and pins of a slot when the PCB is inserted into the slot.

Figure 9:
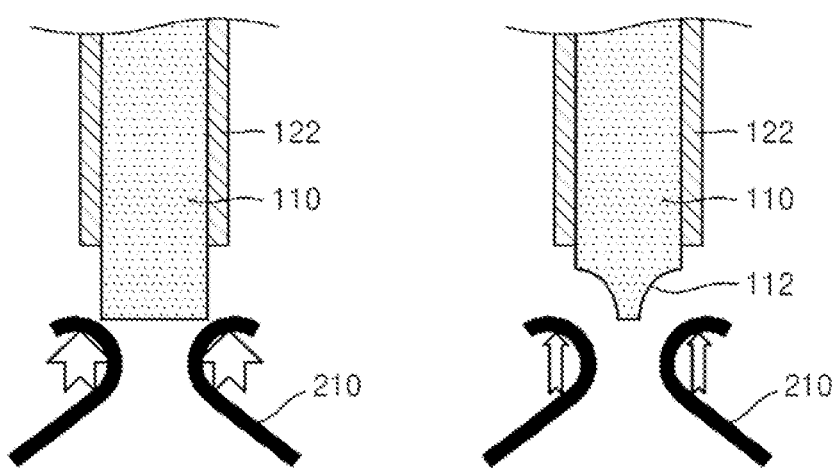
FIG. 9 is a conceptual diagram showing a form in which a conventional PCB or a PCB according to an exemplary embodiment of the inventive concept is inserted into a slot.

FIG. 9 is a conceptual diagram showing forms in which a PCB and a PCB according to any one of the above-described exemplary embodiments of the inventive concept are inserted into slots, respectively. For convenience, only pins 210, which are disposed inside a slot, instead of the whole shape of the slot are illustrated in FIG. 9. Moreover, the tie-bars 124 formed at ends of the tabs 122 of a PCB are omitted.

The left side of FIG. 9 shows a form in which a conventional PCB is inserted into a slot. The right side of FIG. 9 shows a form in which a PCB according to any one of the above-described exemplary embodiments of the inventive concept is inserted into a slot.

In the PCB illustrated on the left side of FIG. 9, a specific shape modification is not made to an edge portion of a body portion 110 on which tabs 122 are formed. Thus, in the PCB, a thickness of a central portion of the body portion 110 is the same as that of the edge portion of the body portion 110. Since a difference between an interval between adjacent pins 210 and the thickness of the body portion 110 is large, resistance by the pins 210, e.g., insertion force, may greatly occur when inserting the conventional PCB into a slot. In order to indicate that insertion force is large, a thick arrow is illustrated on the left side of FIG. 9.

In the case where insertion force is large, when inserting a PCB into a slot, a user may apply a relatively large force to the PCB or twist the PCB left and right, or a force may be transiently concentrated on only one side of the PCB. Such an insertion operation may damage tabs of the PCB and pins of the slot. In addition, such an insertion operation may cause a coupling defect of a semiconductor chip mounted on the PCB. For example, an operation of twisting the PCB left and right when inserting the PCB into the slot may damage a bump or a solder ball coupling semiconductor chips to the PCB, and thus, cracks may be generated in the bump or the solder ball, or the bump or the solder ball may be separated from the PCB or a semiconductor chip.

However, in a PCB according to any of above-described exemplary embodiments of the inventive concept, the groove 112 may be formed in an edge portion in which the tabs 122 are formed. Accordingly, the thickness of the body portion of the PCB may gradually decrease from a central portion of the body portion towards an edge portion thereof and the thickness of the edge portion of the body portion may be substantially similar to or a little larger than an interval between the adjacent pins 210 of the slot. In some cases, the thickness of the edge portion of the body portion may be smaller than the interval between the adjacent pins 210 of the slot. The right side of FIG. 9 illustrates the case where the thickness of the edge portion of the body portion is smaller than the interval between the adjacent pins 210 of the slot.

Consequentially, a PCB according to any of the above-described exemplary embodiments of the inventive concept may be inserted into a slot by small insertion force, and thus, problems occurring in the conventional PCB may be substantially avoided. In order to indicate that insertion force is small, a thin arrow is illustrated on the right side of FIG. 9. Although the case whether the groove 112 is formed in an edge portion of the PCB has been described above, a case where a hole is formed in an edge portion of the PCB may also have a similar effect.

Figure 10:
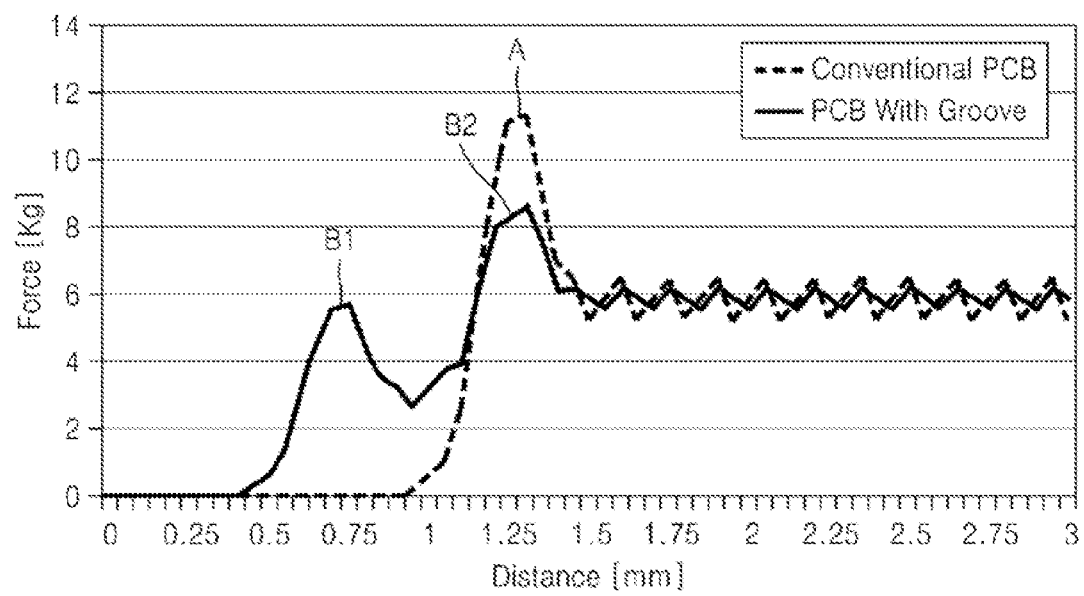
FIG. 10 is a graph of insertion force occurring when a conventional PCB and a PCB according to an exemplary embodiment of the inventive concept is inserted into a slot.

FIG. 10 is a graph of insertion forces occurring when a PCB and a PCB according to any of the above-described exemplary embodiments are inserted into slots. In the PCB, grooves are formed with a disposition such as in FIG. 14A. The x-axis indicates a depth from a surface of the slot, and the y-axis indicates insertion force.

Referring to FIG. 10, in a conventional PCB, very large insertion force occurs at a time, and then substantially constant insertion force is maintained (refer to the dashed line of FIG. 10). Since the thickness of an edge portion of the PCB is larger than an interval between adjacent pins of a slot, at first, a large resistance peak A due to the pins occurs. After a body portion (or tabs) of the PCB is once inserted into the slot by exceeding the resistance peak A, resistance decreases and thus substantially constant insertion force is maintained.

Figure 14A:
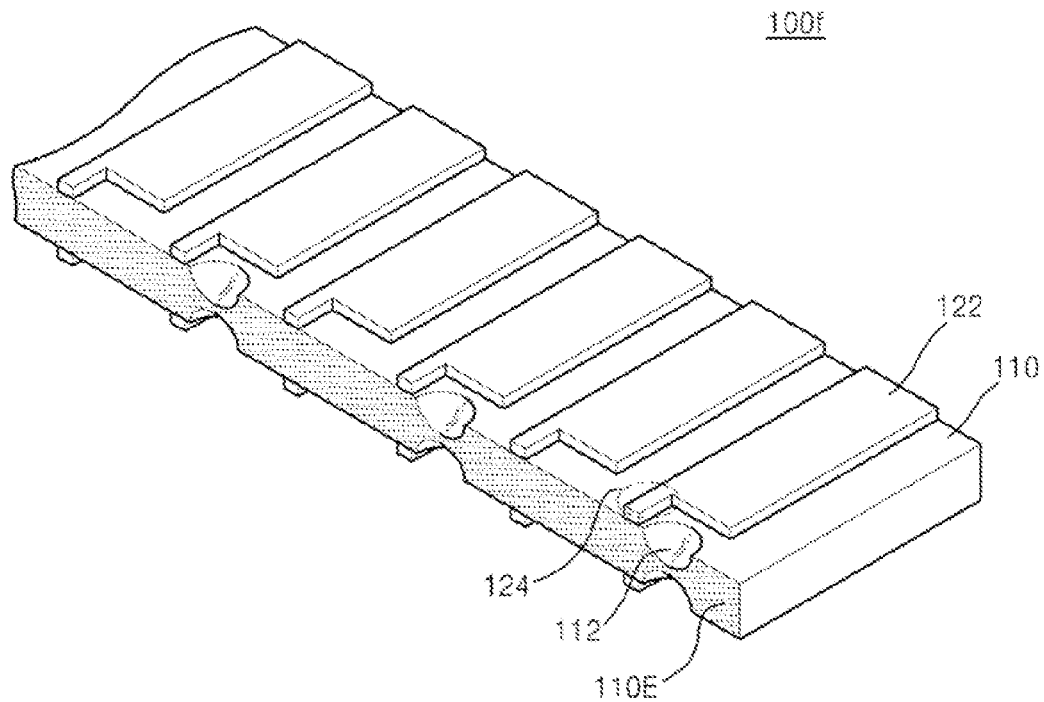
FIGS. 14A and 14B are perspective views showing grooves formed in PCBs according to exemplary embodiments of the inventive concept.

In a PCB according to any of the above-described exemplary embodiments, as illustrated in FIG. 14A, grooves need not be formed to respectively correspond to tabs but may be alternately formed with respect to the tabs. Accordingly, the tabs of the PCB may contact pins of a slot while receiving a gradual force. For example, first, resistance peak B1 of the pins occurs with respect to a body portion (hereinafter, referred to as "a first body portion") corresponding to some tabs with respect to which grooves are not formed. Resistance decreases after passing the first body portion, and then resistance peak B2 of the pins occurs with respect to an inside portion of a body portion (hereinafter, referred to as "a second body portion") corresponding to the other tabs with respect to which grooves are formed.

The resistance peak B2 may be larger than the resistance peak B1 because resistance occurring with respect to the first body portion is maintained to some degree although an edge portion of the first body portion has been passed. Referring to FIG. 10, the resistance peak B2 of the PCB is substantially smaller than the resistance peak A of the PCB. It may be understood that, in the PCB according to an exemplary embodiment of the inventive concept, insertion force is divided into two steps and thus the magnitude of the insertion force becomes relatively small.

Although in the graph of FIG. 10, insertion force regarding a structure in which grooves are alternately disposed with respect to tabs has been illustrated, the inventive concept is not limited thereto. For example, insertion force may be divided into any other form by changing the disposition of grooves. For example, when grooves are formed as in FIG. 14B, insertion force is divided into three steps.

When grooves or holes are formed respectively with respect to tabs, a gradient of resistance is lower. In particular, when grooves are formed as in FIG. 2A or FIG. 3A, a gradient of resistance changes according to curvature of the grooves. When grooves are formed with a step as in FIG. 4A or FIG. 5A, insertion force may be divided similar to the above case where grooves are alternately disposed with respect to tabs. For example, in the case of FIG. 4A, after a first resistance peak is first generated in edge portions of grooves, a second resistance peak will be generated again in back portions of the grooves in which steps are formed.

Figure 11:
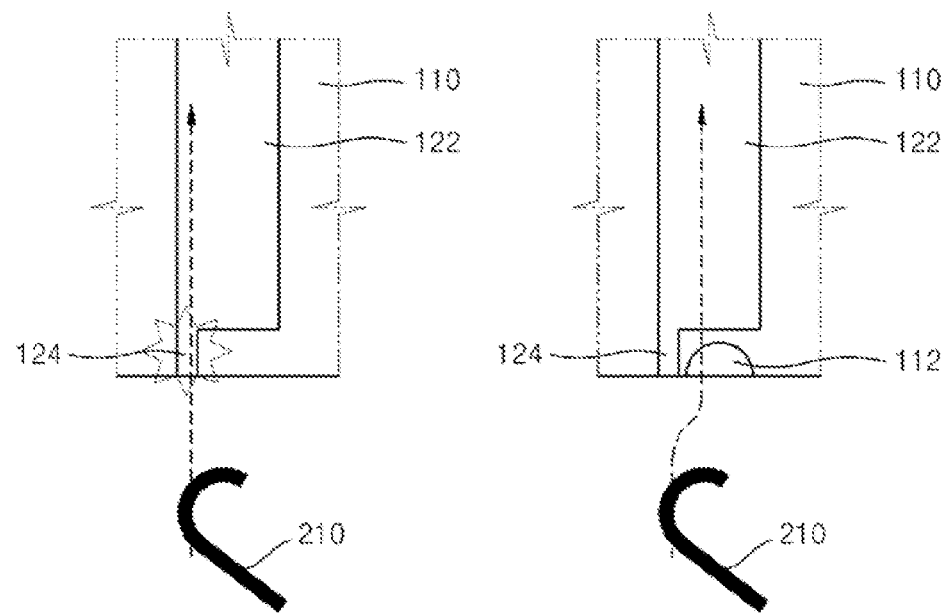
FIG. 11 is a conceptual diagram showing a concept of facilitating correct coupling to a slot through grooves and holes in a PCB according to an exemplary embodiment of the inventive concept.

FIG. 11 is a conceptual diagram showing a concept of facilitating correct coupling to a slot through grooves and holes in a PCB according to any one of the above-described exemplary embodiments. The left side of FIG. 11 shows a form in which a PCB is inserted into a slot, and the right side of FIG. 11 shows a form in which a PCB according to any one of the above-described exemplary embodiments is inserted into a slot.

Referring to the left side of FIG. 11, when the conventional PCB is inserted into a slot, pins 210 of the slot are located at arbitrary positions with respect to tabs 122 of the PCB. Accordingly, the pins 210 may be inserted on tie-bars 124, and thus, the tie-bars 124 may be damaged. In addition, the pins 210 may deviate from the tabs 122 in some cases.

However, in the PCB according to any one of the above-described exemplary embodiments, since grooves or holes are formed to correspond to tabs 122 of the PCB on an edge portion thereof and the grooves or the holes function as a guide, the pins 210 may correctly contact the tabs 122 without damaging tie-bars 124. The grooves or the holes may be formed for all the tabs 122, or may be disposed based on a predetermined rule. For example, the grooves or the holes may be alternately formed with respect to the tabs 122 as in FIG. 14A. Although in this manner the grooves or the holes are disposed based on the predetermined rule, a guide function for the pins 210 may be performed in the same or a similar manner.

FIGS. 12A through 12F are cross-sectional views illustrating processes of a method of manufacturing a PCB, according to an exemplary embodiment of the inventive concept.

Figure 12A:
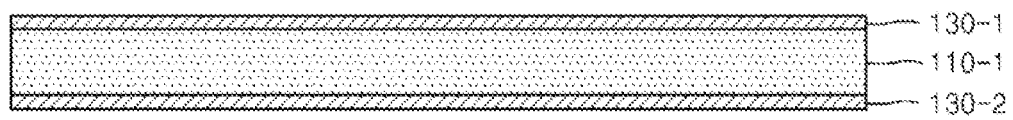
FIGS. 12A through 12F are cross-sectional views illustrating processes of a method of manufacturing a PCB, according to an exemplary embodiment of the inventive concept.

Referring to FIG. 12A, first, a PCB original plate is prepared. The PCB original plate may include an original plate layer 110-1 and copper foils 130-1 and 130-2 formed on the upper side and lower side of the original plate layer 110-1. The PCB original plate is a basic material for making a PCB and is called a copper clad laminate (CCL). Although as shown, copper foils are formed on both sides of the original plate layer 110-1, a copper foil may alternatively be formed on only one side of the original plate layer 110-1.

The original plate layer 110-1 may be formed of resins that are insulators, for example, epoxy resins or phenolic resins. Since an insulation characteristic of the resins is excellent but strength thereof is weak and a size change thereof due to temperature is large, the original plate layer 110-1 may be formed of resins in which paper, glass fiber, a reinforcing agent, or the like has been added. For example, the original plate layer 110-1 may be formed of a material called FR4 (epoxy resins+glass fiber) or FR2 (phenolic resins+paper).

Figure 12B:
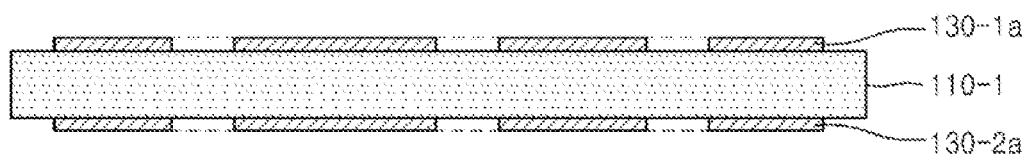

Referring to FIG. 12B, by patterning the copper foils 130-1 and 130-2, a first internal interconnection line 130-1a is formed on the upper side of the original plate layer 110-1 and a second internal interconnection line 130-2a is formed on the lower side of the original plate layer 110-1. Although interconnection lines are shown as being formed on both sides of the original plate layer 110-1, an interconnection line may be formed on only one side of the original plate layer 110-1. A PCB in which an interconnection line is formed on only one side of an insulation substrate, for example, the original plate layer 110-1, is called a single layer PCB, and a PCB in which an interconnection line is formed on both sides thereof is called a double layer PCB.

The patterning on the copper foils 130-1 and 130-2 may be performed through photolithography. For example, first, a laminate film is completely coated on the copper foils 130-1 and 130-2. Then, after manufacturing a mask having a desired interconnection form, the laminate film is treated with ultraviolet radiation using the mask. After the ultraviolet radiation has been applied, a portion of the laminate film that was treated with the ultraviolet rays is removed through a developing process. Next, a patterning on the copper foils 130-1 and 130-2 may be performed by etching exposed portions of the copper foils 130-1 and 130-2 by using a remaining portion of the laminate film as a etch mask and removing the remaining portion of the laminate film.

Here, the first internal interconnection line 130-1a and the second internal interconnection line 130-2a are symmetrically formed about the original plate layer 110-1. However, in some cases, the first internal interconnection line 130-1a and the second internal interconnection line 130-2a need not be symmetrically formed. Although the case where the first internal interconnection line 130-1a and the second internal interconnection line 130-2a are formed of copper has been described, the inventive concept is not limited thereto. For example, the first internal interconnection line 130-1a and the second internal interconnection line 130-2a may be formed of one of other various metals such as aluminum, silver, nickel, and the like. In addition, the first internal interconnection line 130-1a and the second internal interconnection line 130-2a may be formed with a single layer or a plurality of layers.

Figure 12C:
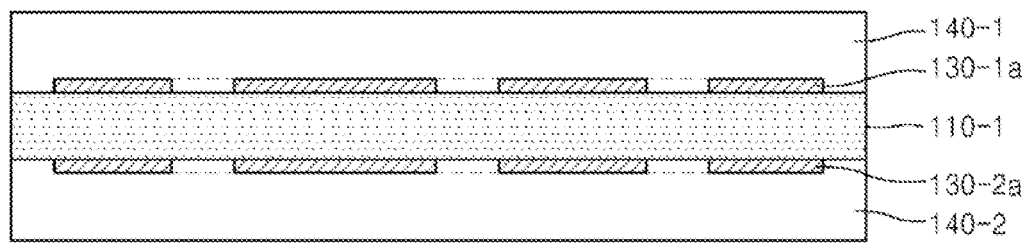

Referring to FIG. 12C, after forming the first internal interconnection line 130-1a and the second internal interconnection line 130-2a, upper and lower insulation layers 140-1 and 140-2 are formed by depositing an insulating material called prepreg on both the upper and lower surfaces of the original plate layer 110-1. The upper and lower insulation layers 140-1 and 140-2 may be formed of any other insulating material.

The prepreg, which is an intermediate material for a fiber reinforcing composite material, indicates a molding material in which matrix resins are preliminarily injected (impregnated) into a reinforcing fiber. Generally, a PCB substrate having a plurality of layers may be formed by stacking prepreg, heating and applying pressure to the prepreg, and then hardening the prepreg. Although a three-layered PCB may be formed by stacking prepreg on both the upper and lower surfaces of the original plate layer 110-1, the inventive concept is not limited thereto. For example, a PCB having five or more layers may be formed by forming four or more prepreg layers. The original plate layer 110-1, the first internal interconnection line 130-1a, the second internal interconnection line 130-2a, and the upper and lower insulation layers 140-1 and 140-2 may constitute the body portion 110 in the PCB 100 of FIG. 2A.

Figure 12D:
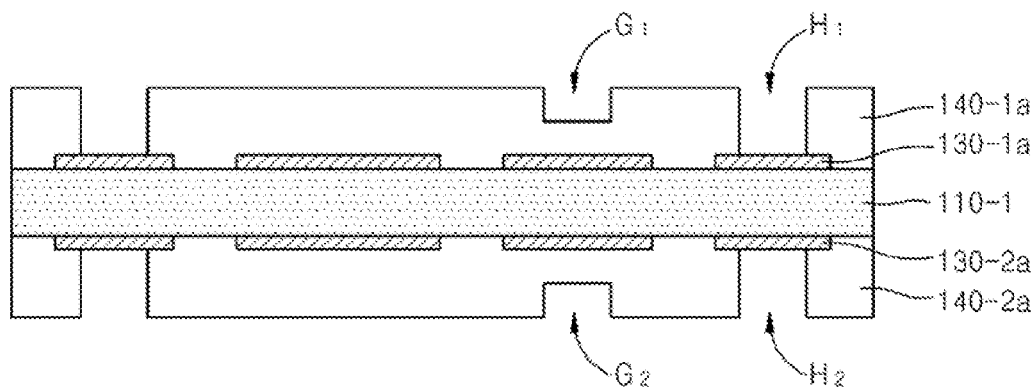

Referring to FIG. 12D, contact holes H1 and H2 respectively penetrating the upper and lower insulation layers 140-1 and 140-2 are formed. A portion of the first internal interconnection line 130-1*a* and a portion of the second internal interconnection line 130-2*a* may be exposed through the contact holes H1 and H2, respectively. Insertion grooves G1 and G2 are formed before or after forming the contact holes H1 and H2 or simultaneously with forming the contact holes H1 and H2. The contact holes H1 and H2 and the insertion grooves G1 and G2 may be formed through various methods. For example, the contact holes H1 and H2 and the insertion grooves G1 and G2 may be formed by using a drill or a laser. In addition, the contact holes H1 and H2 and the insertion grooves G1 and G2 may be formed through an etch process such as photolithography.

The insertion grooves G1 and G2 may be formed by using a stamping apparatus including a predetermined form of a tip or a carving tool having a predetermined form of a tip. For example, the insertion grooves G1 and G2 may be formed by stamping the upper and lower insulation layers 140-1 and 140-2 by using the stamping apparatus including a predetermined form of a tip.

Although the insertion grooves G1 and G2 are described as being formed by removing a portion of upper sides of the upper and lower insulation layers 140-1 and 140-2, respectively, insertion holes that penetrate the upper and lower insulation layers 140-1 and 140-2 and the original plate layer 110-1 may be formed. In addition, although the contact holes H1 and H2 and the insertion grooves G1 and G2, which are formed in the upper and lower insulation layers 140-1 and 140-2, may be formed with a symmetrical structure about the original plate layer 110-1, the contact holes H1 and H2 and the insertion grooves G1 and G2 may alternatively be formed with an unsymmetrical structure.

Figure 12E:
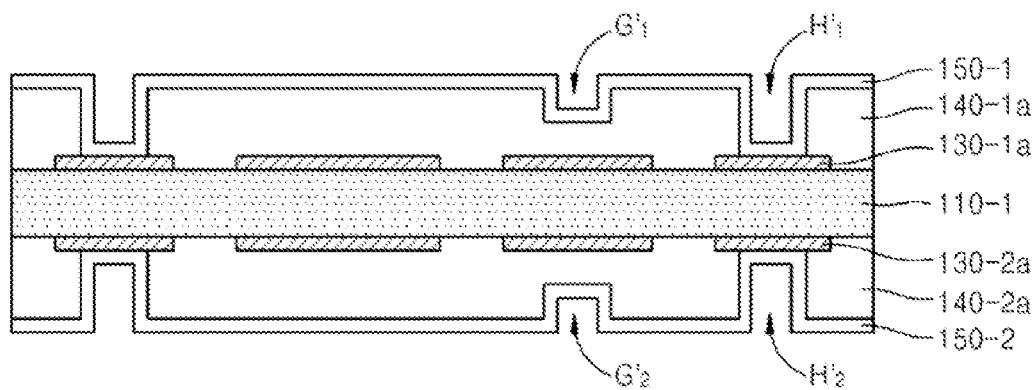

Referring to FIG. 12E, plating layers 150-1 and 150-2 are respectively formed on upper and lower insulation layers 140-1*a* and 140-2*a* after forming the contact holes H1 and H2 and the insertion grooves G1 and G2. The plating layers 150-1 and 150-2 may be formed through an electroless plating and/or an electrolytic plating. For example, first the electroless plating is performed and then the electrolytic plating may be performed by using an electroless plating layer as a seed metal. As illustrated in FIG. 12E, the plating layers 150-1 and 150-2 may be formed in the contact holes H1 and H2 and the insertion grooves G1 and G2 as well as on the upper sides of the upper and lower insulation layers 140-1*a* and 140-2*a*.

Portions of the plating layers 150-1 and 150-2 on the upper and lower insulation layers 140-1*a* and 140-2*a* may electrically contact portions of the first and second internal interconnection lines 130-1*a* and 130-2*a* through the contact holes H1' and H2'. The plating layers 150-1 and 150-2 may be formed of copper, which is the same material as the first and second internal interconnection lines 130-1*a* and 130-2*a*. In some cases, the plating layers 150-1 and 150-2 may be formed of other metal besides copper. For example, the plating layers 150-1 and 150-2 may be formed of Ni, Ni Cu alloys, or the like.

Although the plating layers 150-1 and 150-2 are shown as being respectively formed in the insertion grooves G1' and G2', in some cases, the plating layers 150-1 and 150-2 are not be formed in the insertion grooves G1' and G2' as a result of forming a masking layer with a predetermined form.

Figure 12F:
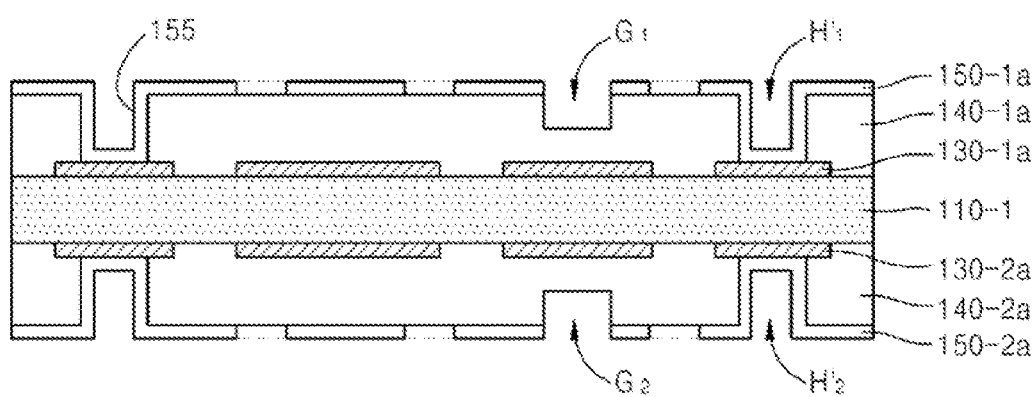

Referring to FIG. 12F, a first external interconnection line 150-1*a* and a second external interconnection line 150-2*a* are formed by respectively patterning the plating layers 150-1 and 150-2. A patterning on the plating layers 150-1 and 150-2 may be performed through an etch method similar to the patterning on the copper foils 130-1 and 130-2 which has been previously performed. In the patterning process for the plating layers 150-1 and 150-2, portions of the plating layers 150-1 and 150-2, which have been formed in the insertion grooves G1' and G2', may be removed. If the plating layers 150-1 and 150-2 have not been formed in the insertion grooves G1' and G2', a patterning is performed on only the other portions of the plating layers 150-1 and 150-2. Portions of the plating layers 150-1 and 150-2, which have been formed in the contact holes H1' and H2', are maintained intact and constitute contacts 155 for connecting the first and second external interconnection lines 150-1*a* and 150-2*a* to the first and second internal interconnection lines 130-1*a* and 130-2*a*, respectively.

The first external interconnection line 150-1*a* and the second external interconnection line 150-2*a* may constitute an external interconnection layer that is exposed to the outside in a PCB according an exemplary embodiment of the inventive concept. The external interconnection layer 120 of FIG. 1 may include interconnection lines exposed in a region in which a chip is mounted and tabs exposed in an edge portion.

Next, a final PCB is completed through a photo solder resist (PSR) coating process, a surface treatment process such as gold plating, organic solderability preservative (OSP), or the like, a routing process, and a bare board test (BBT) process. In this case, the routing process is a process of cutting and dividing a large original substrate into separate PCBs and the BBT process is an electrical test process for the separate PCBs.

Figure 13:
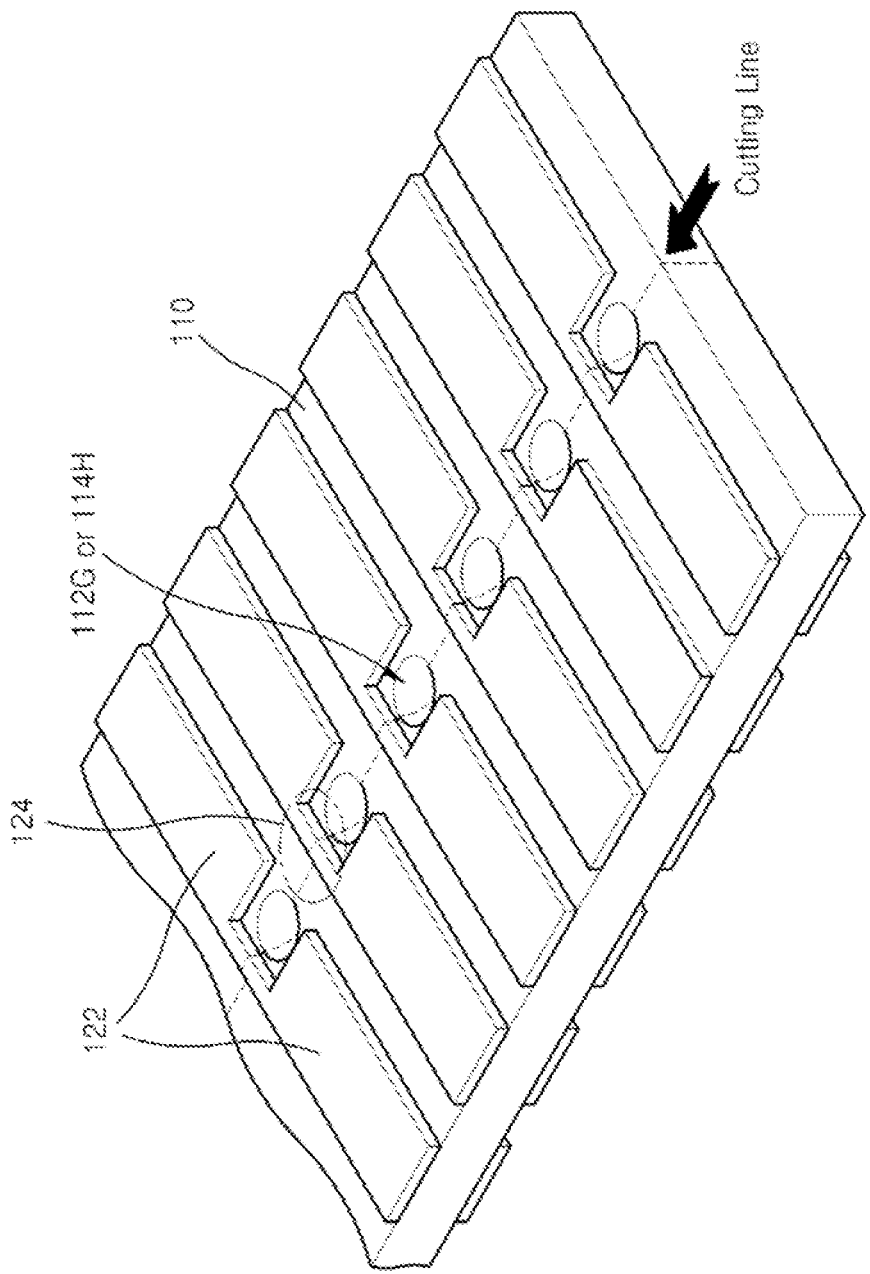
FIG. 13 is a perspective view showing a form in which grooves or holes are formed in an original substrate.

As shown in FIG. 13, forms of insertion grooves or holes 112G or 114H may be finally determined after the routing process.

In the PCB manufacturing processes according to an exemplary embodiment, the insertion grooves or holes 112G or 114H may be formed simultaneously when contact holes are formed or may be formed before or after the contact holes are formed. However, the inventive concept is not limited thereto. For example, the insertion grooves or holes 112G or 114H may be formed in any process after upper and lower insulation layers have been formed. For example, the insertion grooves or holes 112G or 114H may be formed between the surface treatment process and the routing process. In addition, the insertion grooves or holes 112G or 114H may be formed before the PSR coating process after forming external interconnection lines, or may be formed between the PSR coating process and the surface treatment process.

FIG. 13 is a perspective view showing a form in which grooves or holes are formed in an original substrate.

Referring to FIG. 13, the PCB manufacturing method according to an exemplary embodiment may include a series of processes, as illustrated in FIGS. 12A through 12F, which are performed on a large original substrate, and a process of dividing the large original substrate, once the series of processes have been completed, into separate PCBs. According to a PCB manufacturing method, each of the insertion grooves or holes 112G or 114H may be formed in a portion in which both tabs 122 are connected to each other through a tie-bar 124, as illustrated in FIG. 13. In addition, each of the insertion grooves or holes 112G or 114H may be formed to correspond to each of the tabs 122 along a line.

As stated above, after forming the insertion grooves or holes 112G or 114H, a series of processes such as an external interconnection line forming process, a PSR coating process, and the like may be performed, and then a routing process for dividing the large original substrate into separate PCBs may be performed. The routing process is a process of cutting an original substrate along a cutting line by using a blade or a cutting bit to divide the original substrate into separate PCBs. In the PCB manufacturing method according to an exemplary embodiment of the present invention, as the insertion grooves or holes 112G or 114H are formed along the cutting line and each of the insertion grooves or holes 112G or 114H is halved in the routing process, as in the PCB of FIG. 2A or FIG. 6A, the grooves 112 or the holes 114 opened at an edge portion may be formed.

Although in the PCB manufacturing method according an exemplary embodiment, the grooves 112 or the holes 114 are formed in an edge portion on which tabs have been disposed, while each of the insertion grooves or holes 112G or 114H is halved in the routing process, the inventive concept is not limited thereto. For example, the grooves 112 or the holes 114 may be formed in an edge portion on which tabs have been disposed, after the routing process.

Figure 14B:
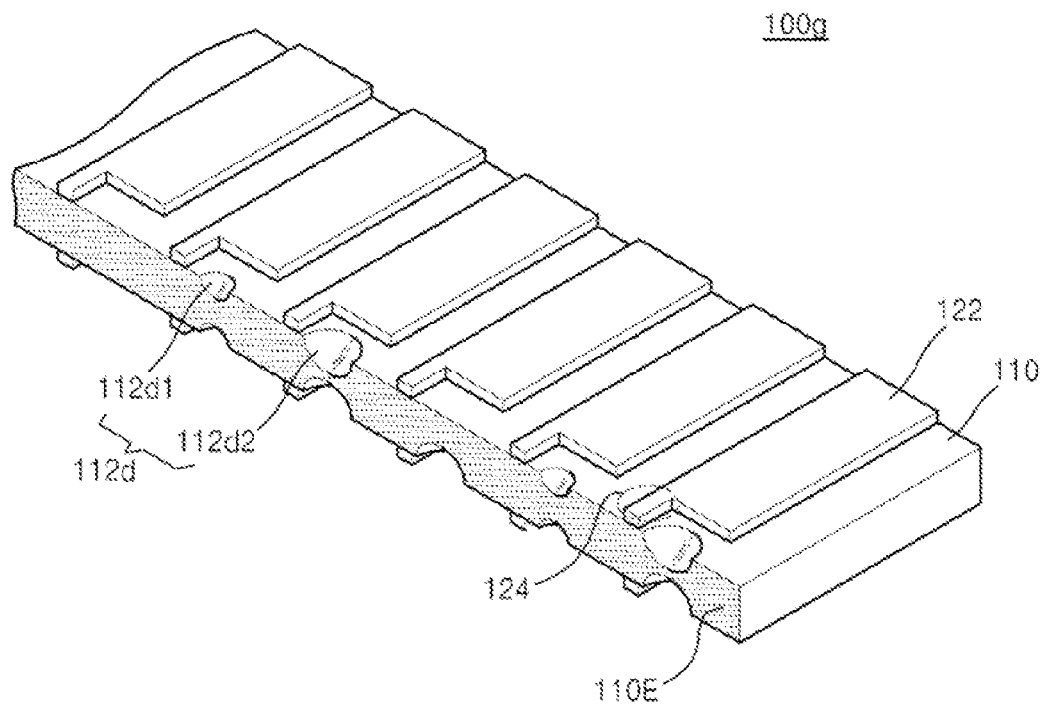

FIGS. 14A and 14B are perspective views showing a rule in which grooves are formed in PCBs according to exemplary embodiments of the inventive concept.

Referring to FIG. 14A, in a PCB 100f according to an exemplary embodiment, one groove is not be formed with respect to each tab 122 but may be formed for every two tabs. For example, grooves 112 may be alternately formed with respect to the tabs 122. When the grooves 112 are disposed as in the PCB 100f, as described above with reference to FIG. 10, insertion force of the PCB 100f may be divided into two steps.

Although in the PCB 100f according to an exemplary embodiment, the grooves 112 are alternately disposed with respect to the tabs 122, holes may be alternately disposed with respect to the tabs 122. In addition, grooves or holes may be disposed based on various rules other than the arrangement in which grooves or holes are alternately disposed with respect to the tabs 122. For example, one groove or one hole may be disposed for every three tabs, or two grooves or two holes may be disposed for every three tabs. Insertion force of the PCB 100f may be divided in various manners according to various disposition rules of grooves or holes.

Referring to FIG. 14B, in a PCB 100g according to an exemplary embodiment, grooves 112d may include first grooves 112d1 and second grooves 112d2. The size of each of the first grooves 112d1 may be smaller than that of each of the second grooves 112d2. In addition, the grooves 112d may be disposed according to the following disposition rule where: the grooves 112d may be formed in a manner in which no groove is formed with respect to a first tab, one of the first grooves 112d1 is formed with respect to a second tab, one of the second grooves 112d2 is formed with respect to a third tab, and no groove is formed with respect to a fourth tab.

When the grooves 112 are formed in such a manner, insertion force of the PCB 100g is divided into three steps. Although two types of grooves having different sizes are formed in the PCB 100g according to an exemplary embodiment, the inventive concept is not limited thereto. For example, grooves having three or more different sizes may be formed in the PCB 100g. In addition, holes instead of grooves may be formed to have different sizes.

Figure 15A:
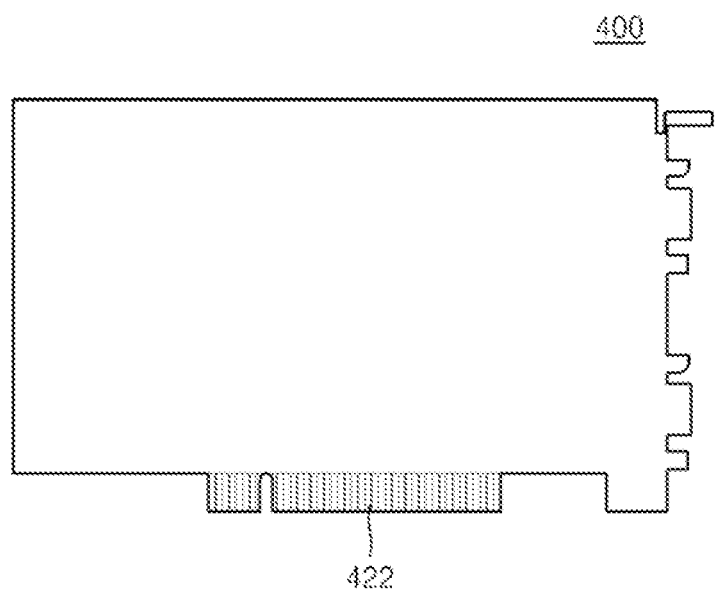
FIGS. 15A and 15B are plan views of peripheral component interconnect (PCI) buses according to exemplary embodiments of the inventive concept.
Figure 15B:
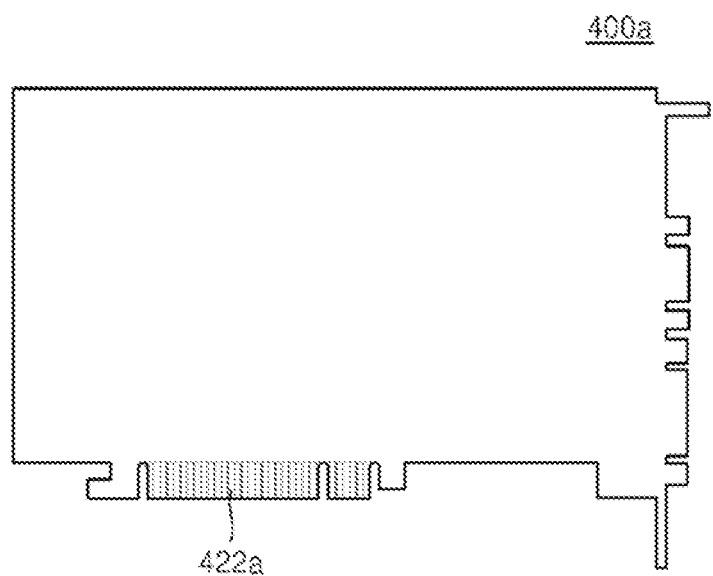

FIGS. 15A and 15B are plan views of peripheral component interconnect (PCI) buses according to exemplary embodiments of the inventive concept. FIG. 15A schematically illustrates a PCI bus 400, and FIG. 15B schematically illustrates a PCI-express bus 400a.

A PCI bus is a kind of a computer bus that is used for mounting a peripheral device on a computer main board. The PCI bus may be divided into an integrated circuit (IC) type that is directly attached to a main board and an expansion card type that is inserted into a socket, i.e., a slot.

The PCI bus 400 and the PCI-express bus 400a may be card types that are used by inserting them into slots. Thus, the PCI bus 400 may include a plurality of tabs 422 protruding at any one edge portion, and the PCI-express bus 400a also may include a plurality of tabs 422a protruding at any one edge portion. In addition, in the PCI bus 400, grooves or holes may be formed according to a predetermined rule with respect to the tabs 422. Also in the PCI-express bus 400a, grooves or holes may be formed according to a predetermined rule with respect to the tabs 422a. Accordingly, when inserting the PCI bus 400 or the PCI-express bus 400a into a slot, insertion force may be substantially reduced, and in addition, correct coupling between the tabs 422 or 422a of the PCI bus 400 or the PCI-express bus 400a and pins of the slot may be facilitated.

The PCI bus 400 and the PCI-express bus 400a each may be, for example, a PCI local area network (LAN) card, a PCI universal serial bus (USB) card, or a PCI graphic card. Although not illustrated, a PCB according to one of the above-described exemplary embodiments may be applied also to an accelerated graphics port (AGP) card, for example, an AGP graphic card, instead of a PCI card. For example, by forming grooves or holes according to a predetermined arrangement rule with respect to tabs of the AGP graphic card, insertion force may be reduced when inserting the AGP graphic card into a slot.

Figure 16:
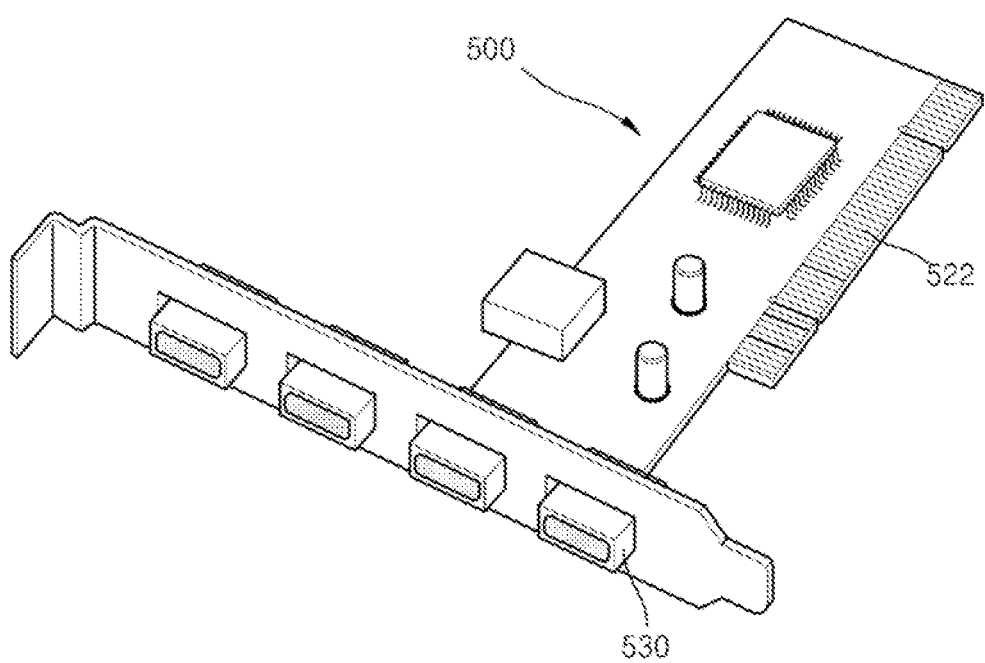
FIG. 16 is a perspective view of a USB card according to an exemplary embodiment of the inventive concept.

FIG. 16 is a perspective view of a USB card 500 according to an exemplary embodiment of the inventive concept.

Referring to FIG. 16, the USB card 500 may include tabs 522 for inserting it into a slot. In addition, in the USB card 500, grooves or holes may be formed according to a predetermined arrangement rule with respect to the tabs 522. Thus, the USB card 500 may be inserted into a slot by small insertion force, and thus, the tabs 522 of the USB card 500 may correctly contact pins of the slot. A reference numeral '530' denotes a USB port to which a USB memory device (not shown) is connected.

Figure 17:
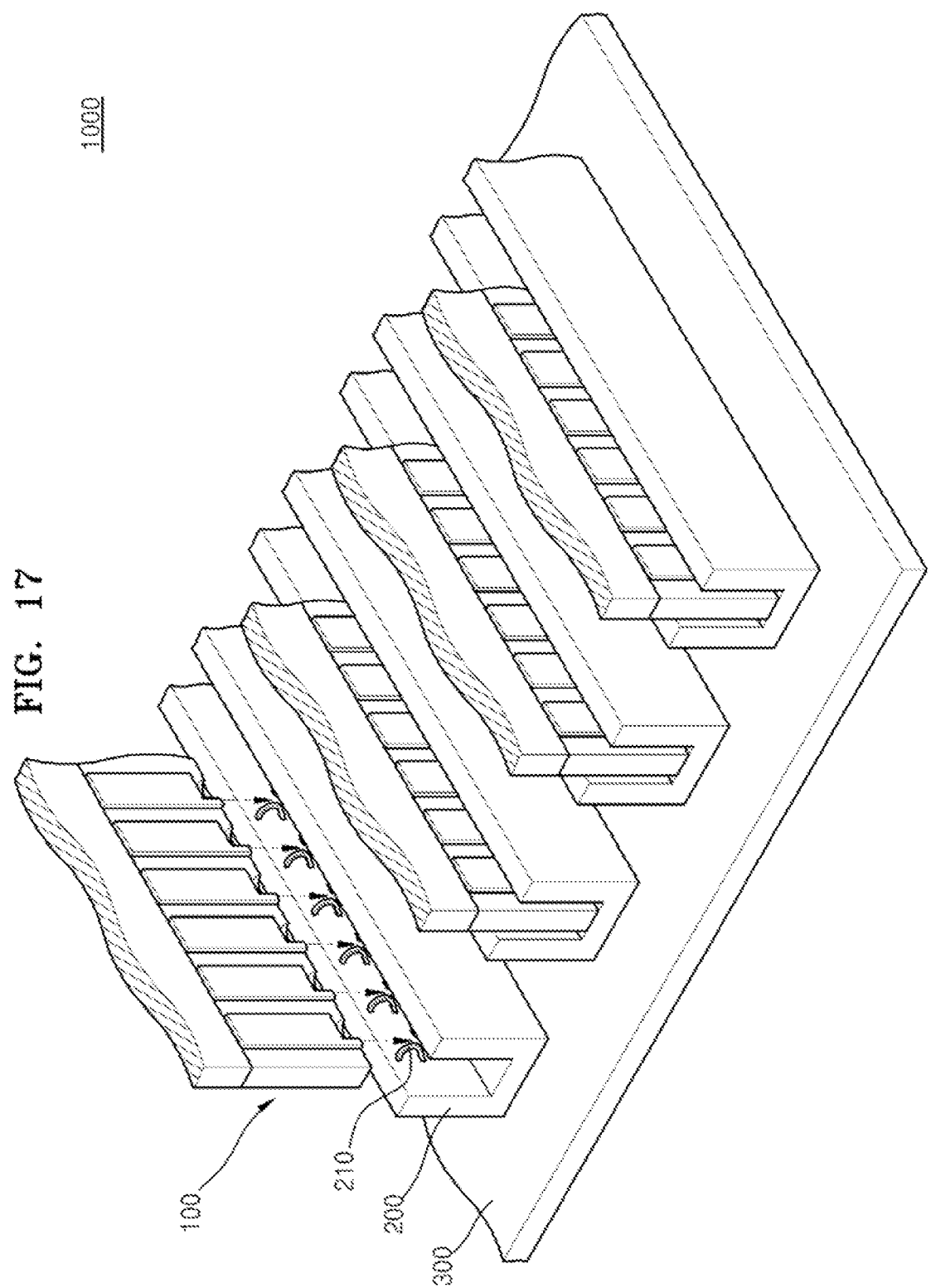
FIG. 17 is a perspective view of a system including a PCB according to an exemplary embodiment of the inventive concept.

FIG. 17 is a perspective view of a system 1000 including a PCB 100 according to any one of the above-described exemplary embodiments of the inventive concept.

Referring to FIG. 17, the system 1000 may include a main board 300, a plurality of slots 200, and the PCB 100.

The main board 300, which is a basic and physical hardware including basic circuits and components of a computer, is called a motherboard. The main board 300 is a part that sets an execution environment of a PC or similar computerized device, maintains information of the PC, controls the PC to be safely driven, and controls data input and output of all devices of the PC.

The plurality of slots 200 are devices that are formed on the main board 300 to mount a peripheral device and a memory module on the main board 300, and, for example, the PCB 100 such as a memory module is inserted into one of the slots 200 to mount the PCB 100 on the main board 300. The slots 200 may include various kinds of slots. For example, the slots 200 may be AGP slots, PCI slots, PCI-express slots, PCI-express 16X slots, PCI-X slots, and/or the like. As illustrated in FIG. 17, a plurality of pins 210 are formed in each of the slots 200 to respectively correspond to tabs of a PCB to be inserted.

The PCB 100 may be a PCB described with reference to FIGS. 1 through 7B and FIGS. 14A through 14B. Thus, grooves or holes may be formed in an edge portion of the PCB 100 according to a predetermined disposition rule with respect to tabs of the PCB 100. The PCB 100 may be a PCB for a memory module on which a plurality of memory chips have been mounted.

Furthermore, the PCB 100 may be a PCB for a PCI card or a USB card described with reference to FIGS. 15A through 16. Also in this case, grooves or holes may be formed in an edge portion of the PCB 100 according to a predetermined disposition rule with respect to tabs of the PCB 100. As describe above, since the grooves or the holes are formed in the edge portion of the PCB 100, on which tabs are formed, the PCB 100 may be inserted into a slot by small insertion force, and the tabs of the PCB 100 may correctly contact pins of the slot by a coupling guide function of the grooves or the holes.

While the inventive concept has been particularly shown and described with reference to exemplary embodiments thereof, it will be understood that various changes in form and details may be made therein without departing from the spirit and scope of the present inventive concept.

What is claimed is:

1. A printed circuit board (PCB) comprising: a body portion comprising a first surface and a second surface opposite to the first surface; and a metal interconnection layer formed on at least one of the first and second surfaces, the metal interconnection layer comprising a plurality of tabs formed along a first edge of the body portion, wherein an insertion force alleviation portion is formed in the first edge of the body portion, below the metal interconnection layer, to reduce an insertion force required to seat the PCB, wherein the insertion force alleviation portion comprises at least one partial-thickness or full-thickness cutout, wherein each of the plurality of tabs includes a tie-bar extending therefrom to a bottom end of the body portion, and wherein each of the at least one partial-thickness or full-thickness cutout is disposed only within a portion of the body portion that is defined by one of the plurality of tabs and its corresponding tie-bar extending therefrom.

2. The PCB of claim 1, wherein the at least one partial-thickness or full-thickness cutout comprises grooves or holes for reducing physical resistance to pins of a slot when the PCB is seated in the slot.

3. The PCB of claim 2, wherein the grooves are formed in the first edge of the body portion and the grooves are formed in the first surface of the body portion, the second surface of the body portion, or in both the first and second surfaces of the body portion.

4. The PCB of claim 3, wherein the grooves are formed such that a thickness of the body portion decreases in the direction of the first edge from the center of the body portion.

5. The PCB of claim 3, wherein the grooves are formed such that the body portion has at least one stepped portion in the direction of the first edge from the center of the body portion.

6. The PCB of claim 3, wherein the grooves correspond to the plurality of tabs.

7. The PCB of claim 6, wherein each of the grooves corresponds to a single tab of the plurality of tabs or each of the grooves corresponds to two tabs of the plurality of tabs.

8. The PCB of claim 2, wherein the holes are formed in the first edge, and horizontal cross sections of the holes have a circular, elliptical, or polygonal form of which a portion is opened in the direction of the first edge.

9. The PCB of claim 8, wherein a groove is formed in each of the holes.

10. The PCB of claim 1, wherein the body portion comprises a plurality of insulation layers and at least one internal interconnection layer formed between each of the plurality of insulation layers and the at least one internal interconnection layer is connected to the metal interconnection layer through a contact penetrating the plurality of insulation layers.

11. The PCB of claim 1, wherein at least one memory chip is mounted to the PCB.

12. a system comprising: a main board; at least one slot installed on the main board; and a printed circuit board (PCB) on which at least one memory chip is mounted, the PCB comprising an insertion portion that is configured to be received into the at least one slot, the insertion portion comprising grooves or holes that are formed in a first edge portion of the insertion portion, wherein the grooves or the holes are configured to provide a reduced physical resistance to pins of the at least one slot when the PCB is inserted into the at least one slot, wherein the PCB further comprises a plurality of tabs for electrically connecting the PCB to the main board, wherein each of the plurality of tabs includes a tie-bar extending therefrom to a bottom end of the PCB, and wherein each of the grooves or the holes is disposed only within a portion of the PCB that is defined by one of the plurality of tabs and its corresponding tie-bar extending therefrom.

13. a printed circuit board (PCB) having a structure that is configured to be received by a slot, wherein a plurality of tabs are formed on a first edge portion of the PCB, which is inserted into the slot, and grooves or holes for reducing physical resistance to pins of the slot when the PCB is inserted into the slot are formed in the first edge portion according to a predetermined disposition rule with respect to the plurality of tabs, wherein each of the plurality of tabs includes a tie-bar extending therefrom to a bottom end of the PCB, and wherein each of the grooves or the holes is disposed only within a portion of the PCB that is defined by one of the plurality of tabs and its corresponding tie-bar extending therefrom.

14. a printed circuit board (PCB) comprising:
a body portion comprising a top surface, a bottom surface opposite to the top surface, a front surface, and a back surface opposite to the front surface; one or more packaged microchips arranged on the front surface of the PCB, the back surface of the PCB, or on both the front and back surfaces of the PCB; a plurality of metal leads formed on a lower portion of the front and back surfaces of the PCB, proximate to the bottom surface of the PCB; and one or more partial-thickness or full-thickness cutout formed in the bottom surface of the body portion, below the metal leads, wherein each of the plurality of metal leads includes a tie-bar extending therefrom to the bottom surface of the PCB, and wherein each of the one or more partial-thickness or full-thickness cutout is disposed only within a portion of the PCB that is defined by one of the plurality of metal leads and its corresponding tie-bar extending therefrom.

* * * * *